US00RE41234E

(19) United States
(12) Reissued Patent
Takahashi et al.

(10) Patent Number: US RE41,234 E
(45) Date of Reissued Patent: Apr. 20, 2010

(54) LIGHT-EMITTING UNIT HAVING SPECIFIC FLUORESCENT MATERIAL

(76) Inventors: Yuji Takahashi, Aichi (JP); Koichi Kaga, Aichi (JP); Koichi Ota, Nishikasugai-gun (JP); Akihito Ota, Nishikasugai-gun (JP); Tadashi Endo, Suginami-ku (JP)

(21) Appl. No.: 11/397,886

(22) Filed: Apr. 5, 2006

Related U.S. Patent Documents

Reissue of:
(64) Patent No.: 6,717,355
Issued: Apr. 6, 2004
Appl. No.: 09/938,624
Filed: Aug. 27, 2001

(30) Foreign Application Priority Data

Aug. 28, 2000 (JP) ..... 2000-258090

(51) Int. Cl.
*C09K 11/08* (2006.01)
*H01J 1/62* (2006.01)

(52) U.S. Cl. ..... 313/501; 252/301.4 R; 252/301.4 F; 313/502; 313/503

(58) Field of Classification Search ..... 252/301.4 F, 252/301.4 R; 313/501, 502, 503; 257/98
See application file for complete search history.

(56) References Cited

U.S. PATENT DOCUMENTS

| | | | | | |
|---|---|---|---|---|---|
| 5,998,925 | A | * | 12/1999 | Shimizu et al. | 313/503 |
| 6,066,861 | A | * | 5/2000 | Hohn et al. | 257/99 |
| 6,284,156 | B1 | * | 9/2001 | Uehara et al. | 252/301.4 F |
| 6,417,019 | B1 | * | 7/2002 | Mueller et al. | 438/29 |
| 6,521,915 | B2 | * | 2/2003 | Odaki et al. | 257/98 |
| 7,262,439 | B2 | * | 8/2007 | Setlur et al. | 257/98 |
| 2004/0046242 | A1 | * | 3/2004 | Asakawa | 257/678 |
| 2005/0189863 | A1 | * | 9/2005 | Nagatomi et al. | 313/486 |
| 2005/0285506 | A1 | * | 12/2005 | Sakuma et al. | 313/503 |

FOREIGN PATENT DOCUMENTS

| | | | | |
|---|---|---|---|---|
| JP | 2000212556 | A | * | 8/2000 |
| JP | 2001214162 | A | * | 8/2001 |
| JP | 2002033521 | A | * | 1/2002 |
| JP | 2004067837 | A | * | 3/2004 |
| JP | 2005048105 | A | * | 2/2005 |

* cited by examiner

*Primary Examiner*—Peter Macchiarolo

(57) ABSTRACT

A light-emitting device with an emission wavelength range of from 360 nm to 550 nm and a fluorescent material made of Ca—Al—Si—O—N oxynitride activated with $Eu^{2+}$ are used so that a part of light emitted from the light-emitting device is emitted while the wavelength of the part of light is converted by the fluorescent material.

48 Claims, 28 Drawing Sheets

LIGHT-EMITTING UNIT HAVING SPECIFIC FLUORESCENT MATERIAL

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a light-emitting unit. Particularly it relates to a light-emitting unit constituted by a combination of a light-emitting device and a fluorescent material.

The present application is based on Japanese Patent Application No. 2000-258090, which is incorporated herein by reference.

2. Description of the Related Art

There has been developed a light-emitting unit in which apart of light emitted from a light-emitting device is subjected to wavelength conversion by a fluorescent material and the part of light which has been subjected to wavelength conversion is mixed with the other part of the light which has not been subjected to wavelength conversion to thereby emit light with an emission light color different from that of the light emitted from the light-emitting device.

For example, a light-emitting unit using a group III nitride compound semiconductor light-emitting device as a light-emitting device for emitting blue light and using an yttrium-aluminum-garnet fluorescent material (YAG) activated with cerium (Ce) as a fluorescent material has been put on the market. In such a light-emitting unit, for example, a cup portion of a lead frame in which a light-emitting device is mounted is filled with a light-transmissible material containing a dispersed fluorescent material (YAG) to thereby form a fluorescent layer in the light-emitting direction of the light-emitting device. In such a configuration, when the light emitted from the light-emitting device passes through the fluorescent layer, a part of the light is radiated after the part of light is absorbed by the fluorescent material (YAG) or the wavelength of the part of light is converted by the fluorescent material. The other part of light is radiated after transmitted through the fluorescent layer without being absorbed by the fluorescent material. As a result, the two kinds of light are mixed with each other to thereby obtain emission of white light.

SUMMARY OF THE INVENTION

An object of the present invention is to provide a novel-configuration light-emitting unit constituted by a combination of a light-emitting device and a fluorescent material. Another object of the present invention is to provide a light-emitting unit high in light-emitting efficiency. A further object of the present invention is to solve the following problems in the background-art light-emitting unit.

According to the present inventors' examination, the color of the emitted light obtained by the aforementioned light-emitting unit is bluish or greenish white. Development of a light-emitting unit for obtaining higher-quality white light has been demanded. That is, development of a light-emitting unit for emitting white light containing red, green and blue components with good balance has been demanded.

The aforementioned light-emitting unit is relatively expensive because the fluorescent material (YAG) used in the light-emitting unit contains rare metal. As a result, the cost of production of the light-emitting unit increases.

It is further difficult to adjust color mixing of the light from the light-emitting device and the light from the fluorescent material, so that it is difficult to stably produce a light-emitting unit with a constant emission color. That is, to obtain a constant emission color, a predetermined quantity of light needs to be converted in wavelength by the fluorescent material. Hence, in the aforementioned background-art configuration, the thickness of the fluorescent layer provided in the light-emitting direction of the light-emitting device needs to be kept constant. It is however difficult to control the thickness of the fluorescent layer accurately because the fluorescent layer is formed, for example, by dripping a fluorescent material-containing light-transmissible material into the cup portion after the light-emitting device is mounted on the lead frame.

The inventors of the present invention have made eager examination to achieve at least one of the foregoing objects. As a result, the following configuration has been conceived. That is, according to the present invention, there is provided a light-emitting unit which comprises:

a light-emitting device for emitting light with a wavelength range of from 360 nm to 550 nm; and a fluorescent material made of Ca—Al—Si—O—N oxynitride activated with $Eu^{2+}$;

wherein a part of light emitted from the light-emitting device is emitted outward after it is subjected to wavelength conversion by the fluorescent material.

According to the aforementioned configuration, there can be provided a light-emitting unit constituted by a novel combination of a light-emitting device with a specific emission peak wavelength and a fluorescent material made of Ca—Al—Si—O—N oxynitride activated with $Eu^{2+}$. In the aforementioned configuration, the fluorescent material is excited by light with a wavelength range of from 360 nm to 550 nm and efficiently emits light with a wavelength longer than that of the excitation light. Hence, the light-emitting unit configured as described above has high emission efficiency. Moreover, the fluorescent material in the aforementioned configuration has a preform composed of Ca, Al, Si, O and N. Hence, it can be said that the fluorescent material can be produced from a general and inexpensive material compared with the fluorescent material (YAG) used in the background art. Hence, a light-emitting unit low in the cost of production can be provided.

Features and advantages of the invention will be evident from the following detailed description of the preferred embodiments described in conjunction with the attached drawings.

DETAILED DESCRIPTION OF THE PREFERRED EMBODIMENTS

Figure 1:
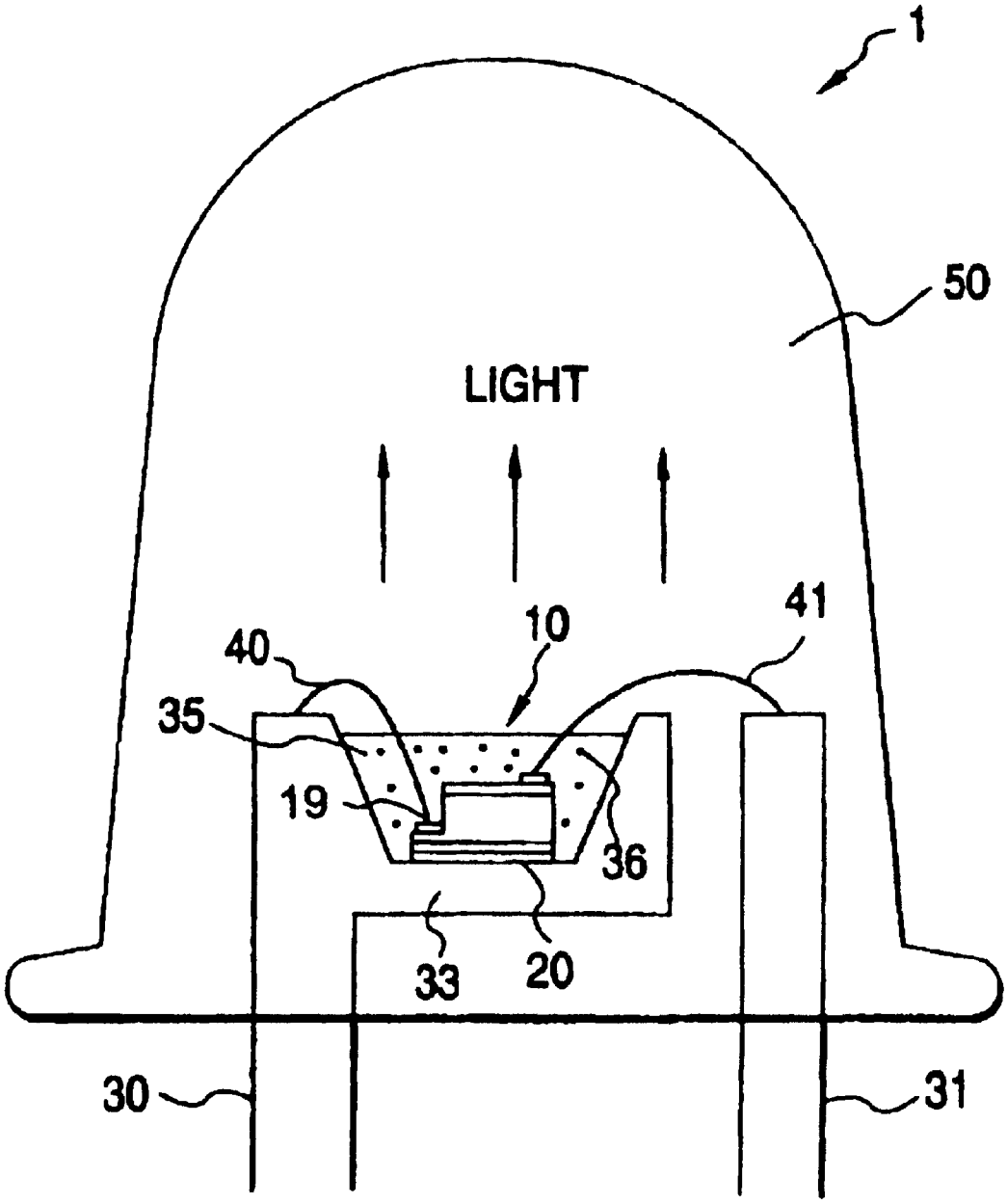
FIG. 1 is a view showing a round-type LED unit 1 which is an embodiment of the present invention.

A light-emitting device with an emission wavelength range of from 360 nm to 550 nm is used. Light with such a wavelength range can be emitted by efficiently exciting a fluorescent material which will be described later. When the light-emitting device is selected, the excitation peak and emission color of the fluorescent material and the total color of light emitted from the light-emitting unit are taken into consideration. To obtain white light emission, a light-emitting device with an emission wavelength range of from 450 nm to 550 nm is preferably used and a light-emitting device with an emission wavelength range of from 450 nm to 500 nm is more preferably used.

When light-emitting devices different in emission wavelength (emission color) are used, the color of light radiated from the light-emitting unit can be changed.

The material for forming the light-emitting device is not particularly limited. A light-emitting device having group III nitride compound semiconductor layers, that is, a group III nitride compound semiconductor light-emitting device can be used preferably. Each group III nitride compound semiconductor is represented by the general formula: $Al_XGa_Y In_{1-X-Y}N$ ($0 \leqq X \leqq 1$, $0 \leqq Y \leqq 1$, $0 \leqq X+Y \leqq 1$) which includes so-called binary compounds such as AlN, GaN and InN, and so-called ternary compounds such as $Al_XGa_{1-X}N$, $Al_XIn_{1-X}N$ and $Ga_XIn_{1-X}N$ (in all cases, $0<X<1$). The group III elements may be partially replaced by boron (B), thallium (Tl), or the like. The nitrogen (N) may be partially replaced by phosphorus (P), arsenic (As), antimony (Sb), bismuth (Bi), or the like. A device function portion of the light-emitting device is preferably constituted by the aforementioned binary or ternary group III nitride compound semiconductor.

The group III nitride compound semiconductor may contain an optional dopant. Si, Ge, Se, Te, C, or the like, can be used as n-type impurities. Mg, Zn, Be, Ca, Sr, Ba, or the like, can be used as p-type impurities. Incidentally, the group III nitride compound semiconductor doped with p-type impurities may be irradiated with electron beams or with plasma or heated in a furnace.

The group III nitride compound semiconductor can be formed by a metal organic chemical vapor deposition method (MOCVD method) or formed by a known method such as a molecular beam epitaxy method (MBE method), a halide vapor phase epitaxy method (HVPE method), a sputtering method, an ion-plating method, an electron showering method, etc.

The material of a substrate on which group III nitride compound semiconductor layers will be grown is not particularly limited so long as the group III nitride compound semiconductor layers can be grown on the substrate. Examples of the substrate material may include sapphire, spinel, silicon, silicon carbide, zinc oxide, gallium phosphate, gallium arsenide, magnesium oxide, manganese oxide, group III nitride compound semiconductor single crystal, and so on. Especially, a sapphire substrate is preferably used. More especially, a surface a of the sapphire substrate is preferably used.

Incidentally, in addition to the aforementioned light-emitting device, a light-emitting device not exciting the fluorescent material, which will be described later, may be used so that the color of light emitted from the light-emitting unit can be changed or adjusted.

Ca—Al—Si—O—N oxynitride activated with $Eu^{2+}$ (Ca—Al—Si—O—N:$Eu^{2+}$) is used as the fluorescent material. The fluorescent material has excitation peaks in about 300 nm and about 490 nm and has an emission peak in a range of from about 580 nm to about 700 nm. Hence, the fluorescent material is excited by the light (with an emission peak in a range of from 360 nm to 550 nm) emitted from the light-emitting device and emits light with a wavelength longer than that of the excitation light. Particularly because the excitation peak of about 490 nm is well matched with the wavelength of blue light, if the fluorescent material is combined with a group III nitride compound semiconductor light-emitting device capable of emitting blue light, light emitted from the light-emitting device can be converted efficiently. On the other hand, light emitted from the fluorescent material used in the present invention exhibits an orange or red color because the fluorescent material has an emission spectrum with an emission peak in a range of from about 580 nm to about 700 nm as described above. Hence, when the fluorescent material is combined with such a blue light-emitting device so that the light emitted from the fluorescent material is mixed with the light emitted from the light-emitting device, emission of white light which is rich in red component so that color rendering characteristic is very high can be obtained.

When the quantity of nitrogen contained in the fluorescent material used in the present invention is increased, the emission peak shifts continuously to the long wavelength side. Hence, the emission wavelength (emission color) of the fluorescent material can be changed by suitably adjusting the contained nitrogen quantity.

The fluorescent material used in the present invention can be prepared as glass or crystal. Any shape can be used as the shape of the fluorescent material. The glass or crystal fluorescent material to be used may be processed into a powdery, granular or plate material. That is, the fluorescent material to be used may be processed into any shape, so that the degree of freedom in shape is high. The concept "plate material" used herein includes a flat plate-like material, a material shaped like a combination of a plurality of flat plates, a material having a curved surface or having a plurality of curved surfaces, a material having a rough and/or curved surface or having a plurality of rough and/or curved surfaces, a material shaped like a cap, a material shaped like a box, and so on.

When the fluorescent material to be used is processed into a powdery or granular material, the mean grain size of the fluorescent material is selected to be preferably not larger than 20 μm, more preferably not larger than 10 μm, most preferably not larger than 5 μm. By reducing the grain size of the fluorescent material, the fluorescent material can absorb the light from the light-emitting device efficiently and convert the wavelength of the light.

It is preferable to use the fluorescent material in the condition that the fluorescent material is processed into a powdery or granular material while it is dispersed into a light-transmissible material. That is, it is preferable to use the fluorescent material as a fluorescent layer. Examples of the light-transmissible material may include epoxy resin, silicone resin, urea resin, glass, and so on. Any one of these materials maybe, of course, used singly, or two or more materials optionally selected from these materials may be used in combination.

The concentration distribution of the fluorescent material in the light-transmissible material can be changed in accordance with the purpose of use, the condition of use, etc. That is, the quantity of the fluorescent material is changed continuously or stepwise as the fluorescent material approaches the light-emitting device. For example, the concentration of the fluorescent material in a portion near the light-emitting device is made high. Hence, the fluorescent material can be efficiently irradiated with the light emitted from the light-emitting device. On the other hand, the fluorescent material is apt to be affected by the heat generated in the light-emitting device, so that deterioration of the fluorescent material becomes a subject of discussion. When the concentration of the fluorescent material contrariwise decreases as the fluorescent material approaches the light-emitting device, the deterioration of the fluorescent material due to the heat generated in the light-emitting device is suppressed.

A layer of the light-transmissible material containing the fluorescent material is provided in the light-emitting direction of the light-emitting device. Preferably, the layer is formed so that the light-emitting direction side of the light-emitting device is covered with the layer. Alternatively, between the layer and the light-emitting device, a layer or space of another light-transmissible material maybe provided.

When the glass fluorescent material is processed into a desired shape, the fluorescent material itself can form a fluorescent layer. Hence, when the glass fluorescent material is molded into a plate material, the quantity of light emitted from the light-emitting device and subjected to wavelength conversion by the fluorescent material can be adjusted by the thickness of the plate material. In this manner, by using the glass fluorescent material, adjustment of color mixing of the light emitted from the fluorescent material and the light emitted from the light-emitting device can be performed easily and accurately.

The fluorescent material used in the present invention has persistence characteristic. Hence, such characteristic maybe used for emitting the light from the light-emitting unit. That is, when the light-emitting device is turned on intermittently, light from the light-emitting device and light from the fluorescent material can be emitted by way of time sharing. Hence, the color of emitted light obtained in the light-emitting unit by mixing of light from the light-emitting device and light from the fluorescent material can be adjusted. Particularly when a blue light-emitting device is used and the light-emitting time of the light-emitting device is adjusted, the color tone of white light emitted from the light-emitting unit can be adjusted delicately. To turn on the light-emitting device intermittently, the light-emitting device may be driven by a pulse current. When, for example, a full-wave rectifier circuit or a half-wave rectifier circuit is used, the light-emitting device can be driven by direct use of an AC current.

The fluorescent material used in the present invention is disposed in a position where the fluorescent material can be irradiated with the light emitted from the light-emitting device. Hence, the fluorescent material emits light by using the light emitted from the light-emitting device. That is, a part of the light emitted from the light-emitting device is subjected to wavelength conversion by the fluorescent material. As a result, light with a wavelength (emission color) different from that of the light emitted from the light-emitting device is generated. The light subjected to wavelength conversion is mixed with the other part of light not subjected to wavelength conversion by the fluorescent material, so that the mixed light is emitted finally. Hence, emission of light with a color different from that of the light emitted from the light-emitting device is obtained in the light-emitting unit as a whole. Incidentally, the color of emitted light can be changed when the composition of the fluorescent material is changed. Accordingly, the total color of light emitted from the light-emitting unit can be adjusted.

When a configuration in which the fluorescent material is dispersed into a layer of the light-transmissible material so that light emitted from the light-emitting device passed through this layer is made as described above, light emitted from the light-emitting device and light emitted from the fluorescent material are automatically mixed with each other in this layer. The mode of mixing of the light emitted from the light-emitting device and the light emitted from the fluorescent material is however not limited to the above description. For example, the fluorescent material may be disposed in the form of islands around the light-emitting device. In this case, a part of light emitted from the light-emitting device passes between the fluorescent material islands so that the part of light and light emitted from the fluorescent material can be mixed with each other, for example, in a sealing member. Alternatively, in the light-emitting unit, the fluorescent material may be disposed in a position distanced from the optical axis of the light-emitting device so that light emitted from the fluorescent material is condensed into the direction of the optical axis by use of a reflection plate or the like and then mixed with light emitted from the light-emitting device.

The configuration of the present invention will be described in more detail on the basis of embodiments thereof.

(Embodiment 1)

FIG. 1 is a view showing a round-type LED unit 1 which is an embodiment of the present invention. The LED unit 1 emits white light. For example, the LED unit 1 may be combined with a light guide so that the LED unit 1 can be used in a plane light source or a linear light source or used in any kind of display device or the like.

Figure 2:
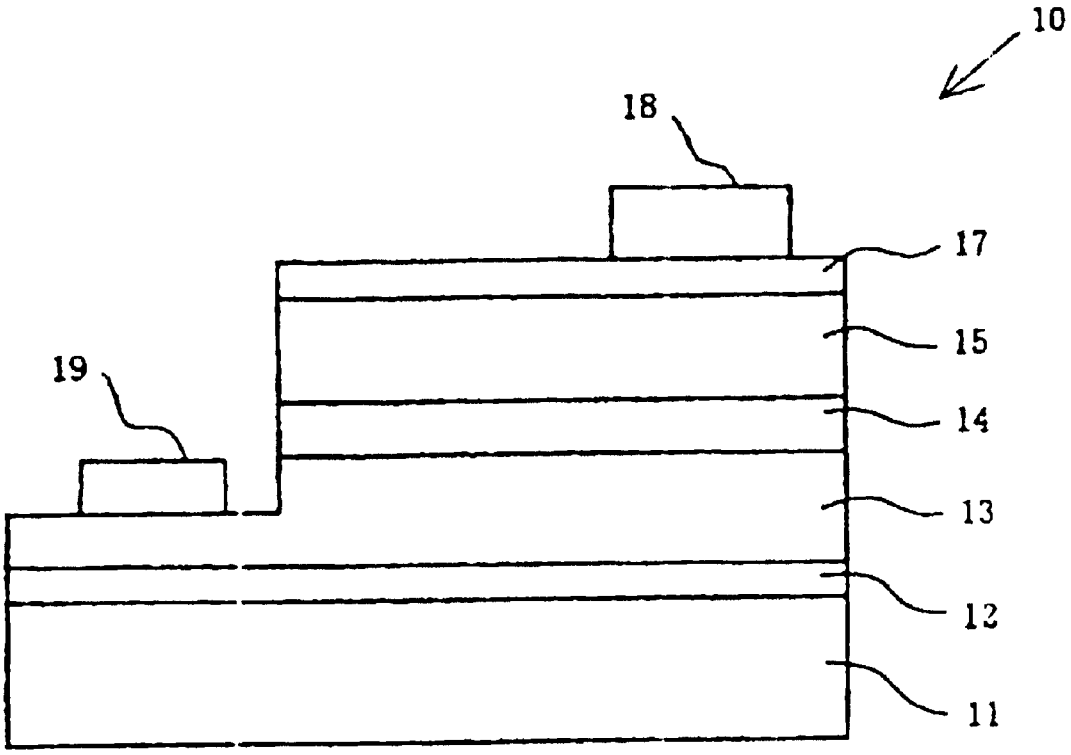
FIG. 2 is a schematic sectional view of a light-emitting device 10 used in the LED unit 1.

FIG. 2 is a sectional view showing a light-emitting device 10 used in the LED unit 1. The wavelength of light emitted from the light-emitting device 10 is about 480 nm. Specifications of respective layers in the light-emitting device 10 are as follows:

TABLE 1

| | "APOLLO" | "Galena" | "Nugget" | "Zeus" |
|---|---|---|---|---|
| Alpha acids % w/w | 15-19 | 10-13.5 | 11-14 | 12-16.5 |
| Beta acids % w/w | 5.5-8.0 | 7.0-9.0 | 4.0-6.0 | 4.0-6.0 |
| CoH % w/w of alpha acids | 24-28 | 35-40 | 24-30 | 27-35 |
| Total Oil ml/100 g | 1.5-2.5 | 0.9-1.2 | 1.5-3.0 | 1.0-2.0 |
| Humulene % | 20-35 | 10-15 | 12-22 | 10-25 |
| Caryophyllene % | 14-20 | 3.0-5.0 | 7-10 | 5.0-15 |
| Powdery Mildew Disease | Resistant | Susceptible | Resistant | Susceptible |
| Cone Yield lbs/acre | 2800-3200 | 1600-2220 | 1700-2200 | 2400-3000 |

| Layer: | Composition: | Dopant | (Thickness) |
|---|---|---|---|
| p-type layer 15: | p-GaN: | Mg | (0.3 μm) |
| Light-emitting layer 14: | Superlattice structure | | |
| Quantum well layer: | $In_{0.15}Ga_{0.85}N$ | | (3.5 nm) |
| Barrier layer: | GaN | | (3.5 nm) |
| The number of repeated quantum well and barrier layers: 1 to 10 | | | |
| n-type layer 13: | n-GaN: | Si | (4 μm) |
| Buffer layer 12: | AlN | | (10 nm) |
| Substrate 11: | Sapphire | | (300 μm) |

The buffer layer 12 is used for growing a high-quality semiconductor layer. The buffer layer 12 is formed on a surface of the substrate 11 by a known MOCVD method or the like. Although this embodiment shows the case where AlN is used as the buffer layer, the buffer layer is not limited thereto. For example, a binary compound such as GaN or InN, a group III nitride compound semiconductor (ternary compound) represented by the general formula $Al_xGa_yN$ ($0<x<1$, $0<y<1$, $x+y=1$) or a group III nitride compound semiconductor (quarternary compound) represented by the general formula $Al_aGa_bIn_{1-a-b}N$ ($0<a<1$, $0<b<1$, $a+b\leqq 1$) may be used as the buffer layer.

Each semiconductor layer is formed by a known MOCVD method. In the growth method, an ammonia gas and group III element alkyl compound gases such as trimethylgallium (TMG), trimethylaluminum (TMA) and trimethylindium (TMI) are supplied onto a substrate heated to a suitable temperature and are subjected to a thermal decomposition reaction to thereby make a desired crystal grown on the buffer layer 12. It is a matter of course that the method of forming each semiconductor layer is not limited to the above description and that each semiconductor layer may be formed by a known MBE method.

The n-type clad layer 13 may be of a double-layered structure having an $n^-$ layer of low electron concentration on the light-emitting layer 14 side and an $n^+$ layer of high electron concentration on the buffer layer 12 side. The latter is called n-type contact layer.

The structure of the light-emitting layer is not limited to the case where the light-emitting layer 14 has a superlattice structure. A single hetero type structure, a double hetero type structure or a homo junction type structure may be used as the structure. Alternatively, the light-emitting layer may be formed by use of an MIS junction or a PIN junction.

An $Al_XGa_YIn_{1-X-Y}N$ ($0\leqq X\leqq 1$, $0\leqq Y\leqq 1$, $X+Y\leqq 1$) layer doped with an acceptor such as magnesium and having a wide band gap may be interposed between the light-emitting layer 14 and the p-type layer 15. This technique is provided for preventing electrons imparted into the light-emitting layer 14 from diffusing to the p-type layer 15.

The p-type layer 15 may be of a double-layered structure having a $p^-$ layer of low hole concentration on the light-emitting layer 14 side and a $p^+$ layer of high hole concentration on the p-type electrode 18 side. The latter is called p-type contact layer.

The n-type electrode 19 is constituted by two layers of Al and V. After the p-type layer 15 is formed, the p-type layer 15, the light-emitting layer 14 and the n-type layer 13 are partially removed by etching. Then-type electrode 19 is formed on the n-type layer 13 by vapor deposition.

The light-transmissible electrode 17 is constituted by a thin film containing gold. The light-transmissible electrode 17 is laminated so that the substantially whole upper surface of the p-type layer 15 is covered with the light-transmissible electrode 17. The p-type electrode 18 is also constituted by a material containing gold. The p-type electrode 18 is formed on the light-transmissible electrode 17 by vapor deposition.

After the respective semiconductor layers and electrodes are formed in the aforementioned steps, the step of separating the resulting laminate into respective chips is carried out.

Figure 3:
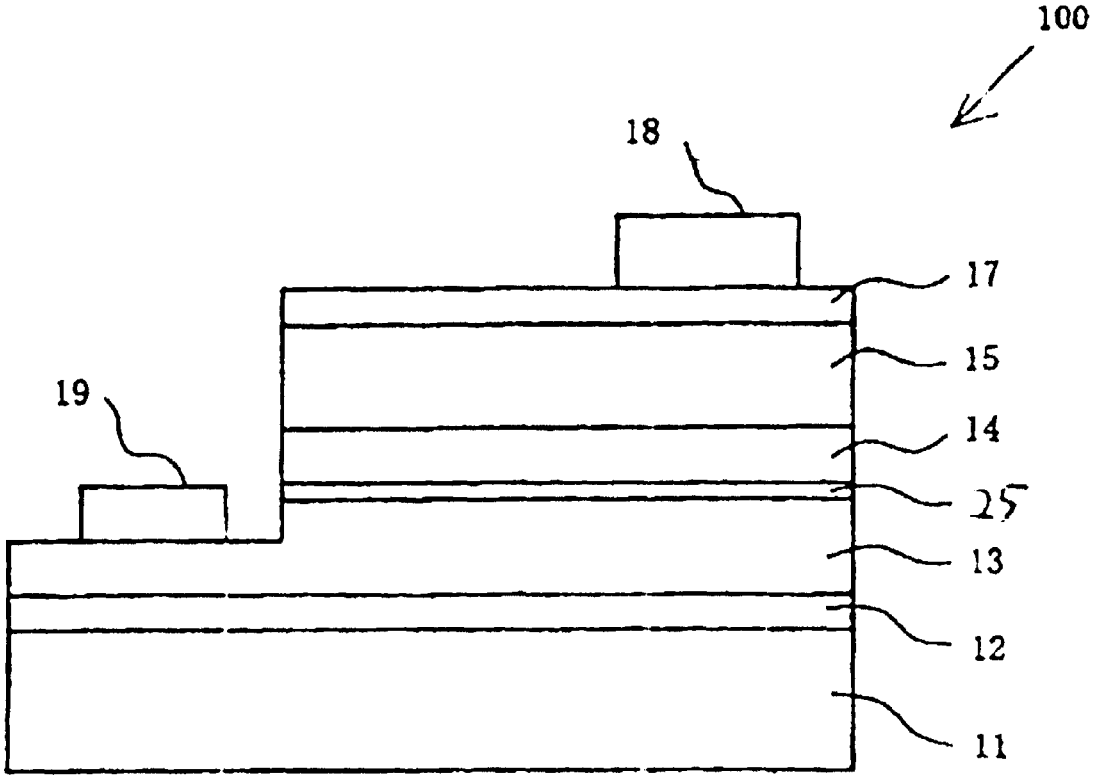
FIG. 3 is a schematic sectional view of a light-emitting device 100 having a reflection layer just under a light-emitting layer.
Figure 4:
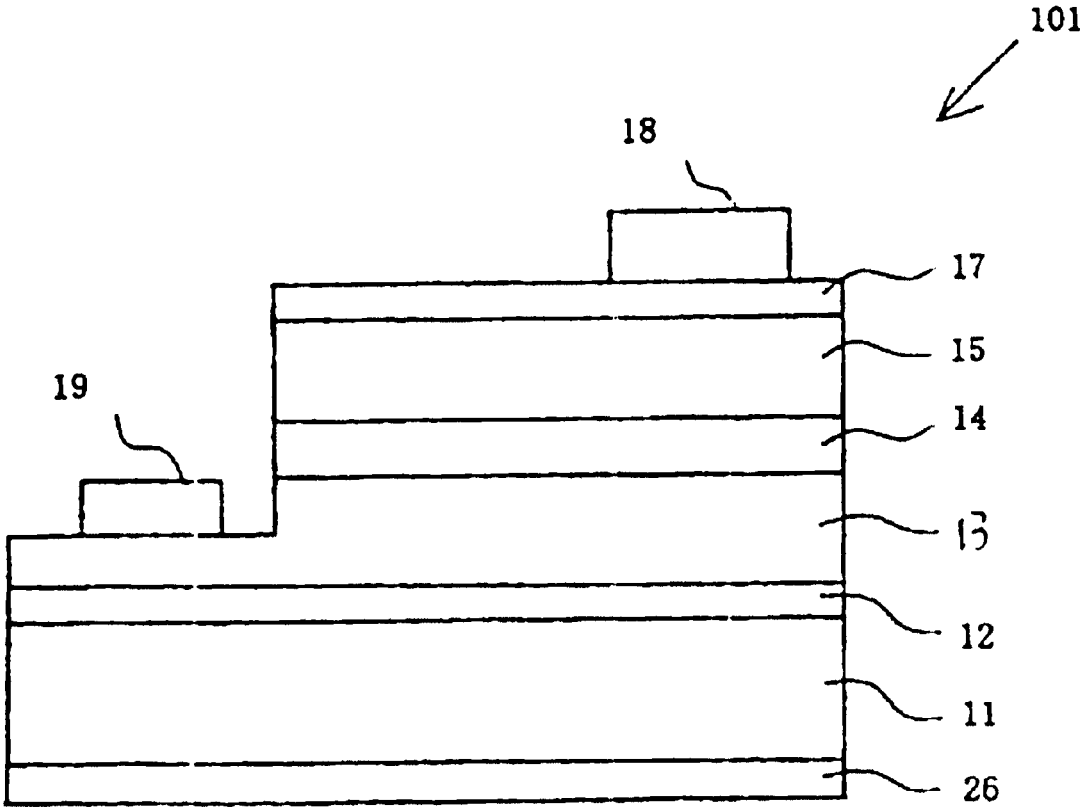
FIG. 4 is a schematic sectional view of a light-emitting device 101 having a reflection layer on a surface of a substrate where no semiconductor layer is formed.

A reflection layer may be provided between the light-emitting layer 14 and the substrate 11 or on a surface of the substrate 11 where the semiconductor layer is not formed. When such a reflection layer is provided, light generated from the light-emitting layer 14 and emitted toward the substrate side can be reflected efficiently toward the light-extracting direction. As a result, improvement of light-emitting efficiency is attained. FIGS. 3 and 4 show light-emitting devices 100 and 101 having reflection layers respectively. Incidentally, in each of the light-emitting devices 100 and 101, parts the same as those of the light-emitting device 10 are referenced correspondingly.

In the light-emitting device 100, a reflection layer 25 is formed just under the light-emitting layer 14. In the light-emitting device 101, a reflection layer 26 is formed on a surface of the substrate 11 where the semiconductor layer is not formed. The reflection surface 25 is made from metal nitride. Preferably, one member selected from the group consisting of titanium nitride, zirconium nitride and tantalum nitride is used optionally or two or more members selected from the aforementioned group are used optionally in combination. The reflection layer 26 can be made from metal nitride in the same manner as the reflection layer 25. A single metal such as Al, In, Cu, Ag, Pt, Ir, Pd, Rh, W, Mo, Ti, Ni or the like may be used for forming the reflection layer 26 or two or more metals selected optionally from these metals may be used for forming the reflection layer 26.

The light-emitting device 10 is mounted, by an adhesive agent 20, into the cup portion 33 provided in the lead frame 30. The adhesive agent 20 is constituted by silver paste which is a mixture of an epoxy resin with silver as a filler. Use of such silver paste permits heat to be radiated from the light-emitting device 10 well. Incidentally, the silver paste may be replaced by any other known adhesive agent.

The cup portion 33 is filled with an epoxy resin (hereinafter referred to as "fluorescent resin") containing fluorescent materials 36 dispersed evenly. The cup portion 33 may be filled with the epoxy resin containing the fluorescent materials 36 after wire bonding which will be described later. Alternatively, a layer containing the fluorescent materials 36 may be formed on a surface of the light-emitting device 10 before the light-emitting device 10 is mounted into the cup portion 33. For example, the fluorescent resin layer is formed on a surface of the light-emitting device 10 by dipping the light-emitting device 10 in an epoxy resin containing the fluorescent materials 36. Then, the light-emitting device 10 is mounted into the cup portion 33 by use of silver paste. Besides dipping, sputtering, application, coating or the like maybe used as the method of forming the fluorescent resin layer.

The configuration in which the cup portion 33 is filled with the fluorescent resin may be replaced by a configuration in which a layer of a fluorescent resin is provided on a surface of the light-emitting device 10 or on respective surfaces of the light-emitting device 10 and the cup portion 33.

A granular material (mean grain size: 5 μm) of Ca—Al—Si—O—N oxynitride glass activated with $Eu^{2+}$ is used as the fluorescent materials 36. The fluorescent materials are prepared as follows. First, starting materials such as metal oxide ($CaCO_3$, $Al_2O_3$ and $SiO_2$), AlN and $Eu_2O_3$ are weighed and mixed in predetermined ratios. The mixture is wrapped in molybdenum foil. The mixture is melted under an Ar atmosphere at a temperature of from 1600° C. to 1800° C. for 2 hours by use of a high-frequency induction heater so as to be reacted. After the reaction, the mixture is quenched to thereby obtain granular Ca—Al—Si—O—N oxynitride glass. Finally, the glass is pulverized until the mean grain size of the glass reaches a desired value.

The fluorescent materials 36 prepared in the aforementioned manner are dispersed into an epoxy resin. Although this embodiment shows the case where an epoxy resin is used as a base material for dispersing the fluorescent materials 36, the base material is not limited to the epoxy resin. For example, a transparent material such as silicone resin, urea resin, glass or the like may be used as the base material. Although this embodiment shows the case where the fluorescent materials 36 are dispersed evenly into the fluorescent resin 35, the concentration distribution of the fluorescent materials 36 in the fluorescent resin 35 may have a gradient. For example, epoxy resins different in the concentration of the fluorescent materials 36 may be used so that a plurality of fluorescent resin layers different in the concentration of the fluorescent materials 36 are formed into the cup portion 33. Further, the concentration of the fluorescent materials 36 may be changed continuously.

The fluorescent resin 35 may further contain a diffusing agent such as titanium oxide, titaniumnitride, tantalumnitride, aluminum oxide, silicon oxide, barium titanate, etc.

The fluorescent materials 36 maybe contained in a sealing resin 50 which will be described later. In this case, the fluorescent resin 35 can be omitted. That is, in this case, the cup portion 33 is filled with the sealing resin 50 containing the fluorescent materials 36. Also in this case, the concentration distribution of the fluorescent materials 36 in the sealing resin 50 may have a gradient in the same manner as in the fluorescent resin 35.

The p-type electrode 18 and the n-type electrode 19 in the light-emitting device 10 are wire-bonded to lead frames 31 and 30 by wires 41 and 40 respectively.

Then, the light-emitting device 10, part of the lead frames 30 and 31 and the wires 40 and 41 are sealed with the sealing resin 50 constituted by an epoxy resin. The material of the sealing resin 50 is not particularly limited if the material is transparent. Besides the epoxy resin, silicone resin, urea resin or glass can be used preferably. Further, it is preferable, from the point of view of adhesion to the fluorescent resin 35, refractive index, etc., that the sealing resin is made from the same material as that of the fluorescent resin 35.

The sealing resin 50 is provided for the purpose of protection of the device structure or the like. The shape of the sealing resin 50 maybe changed in accordance with the purpose so that a lens effect can be given to the sealing resin 50. For example, besides the round-type shape shown in FIG. 1, a concave lens type shape or a convex lens type shape may be used as the molded shape of the sealing resin 50. Further, the sealing resin 50 may be shaped like a circle, an ellipse or a rectangle viewed from the light-extracting direction (upward in FIG. 1).

Even in the case where the fluorescent resin 35 is not omitted, the fluorescent materials 36 may be dispersed into the sealing resin 50.

The sealing resin 50 may further contain a diffusing agent. Use of the diffusing agent permits relaxation of directivity of light emitted from the light-emitting device 10. Examples of the diffusing agent used are titanium oxide, titanium nitride, tantalum nitride, aluminum oxide, silicon oxide, barium titanate, and so on.

The sealing resin 50 may further contain a coloring agent. The coloring agent is used for preventing the fluorescent materials from exhibiting a peculiar color when the light-emitting device is turned on or off.

When light emitted from the light-emitting device 10 contains a large amount of components with reference to wavelengths in the whole range of the ultraviolet-rays, the sealing resin 50 may further contain an ultraviolet absorbing agent so that the life of the light-emitting device 10 can be prolonged.

Incidentally, one member selected from the group consisting of the fluorescent materials 36, the diffusing agent, the coloring agent and the ultraviolet absorbing agent may be optionally contained in the sealing resin 50 or two or more members selected from the aforementioned group maybe optionally contained in the sealing resin 50.

In the LED unit 1 configured as described above, the wavelength of a part of blue light emitted from the light-emitting device 10 is converted by the fluorescent materials 36. The part of light with the converted wavelength is mixed with the other part of blue light emitted from the light-emitting device 10. The mixed light is radiated to the outside. As a result, emission of white light is obtained from the LED unit 1.

Figure 5A:
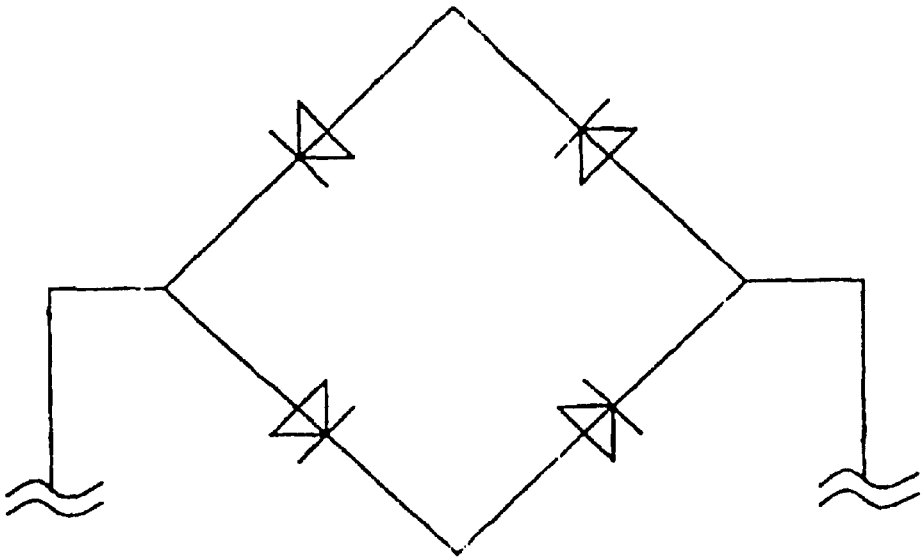
FIGS. 5A and 5B are views showing rectifier circuits used in Embodiment 1.
Figure 5B:
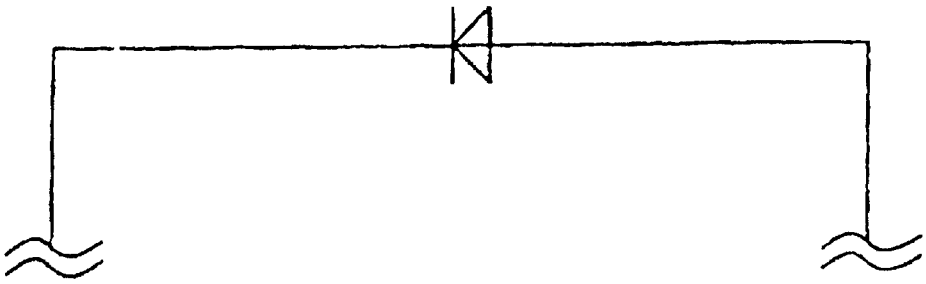

As for the method of driving the LED unit 1, the LED unit 1 can be driven by a pulse current. Hence, light from the light-emitting device 10 and light from the fluorescent materials 36 are emitted by way of time sharing, so that the color of light emitted from the LED unit 1 can be adjusted. For example, a full-wave rectifier circuit shown in FIG. 5A or a half-wave rectifier circuit shown in FIG. 5B maybe connected to the LED unit 1, and an AC current is supplied to the rectifier circuit.

In addition to the light-emitting device 10, any other light-emitting device may be used in combination. A light-emitting device with an emission wavelength different from that of the light-emitting device 10 is used as the other light-emitting device. Preferably, a light-emitting device with such an emission wavelength as not to substantially excite the fluorescent materials 36 for emission of light is used as the other light-emitting device. Use of the other light-emitting device permits the emission color of the LED unit 1 to be changed or adjusted. Alternatively, a plurality of light-emitting devices 10 may be used so that luminance can be increased.

Figure 6A:
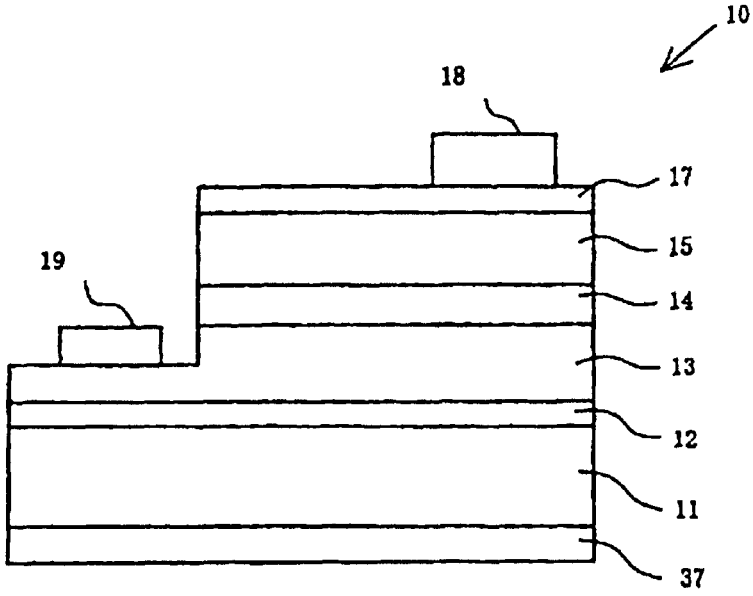
FIGS. 6A and 6B are views showing light-emitting devices 10 each having a fluorescent layer 37 with which the substrate surface is covered.
Figure 6B:
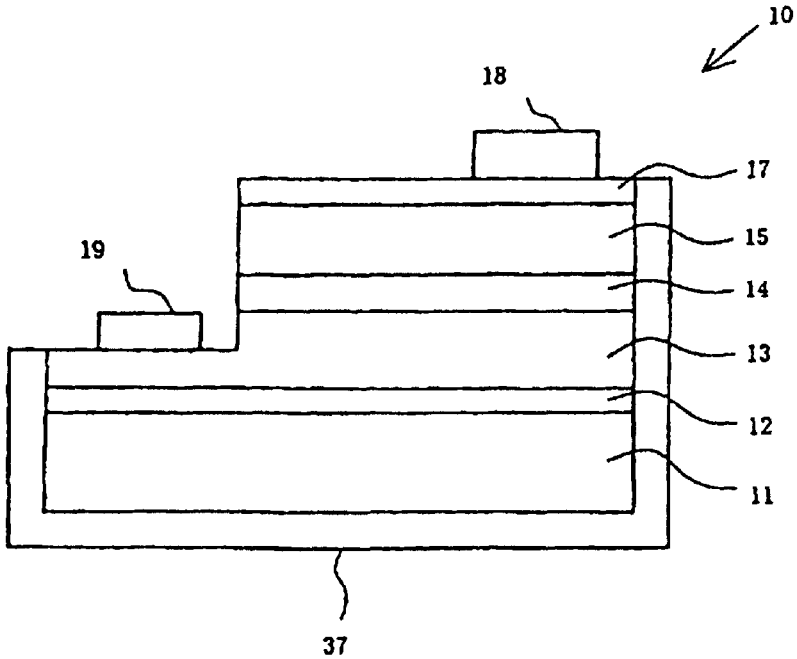

In the LED unit 1, a fluorescent layer 37 with which the substrate surface of the light-emitting device 10 is covered maybe provided as shown in FIG. 6A or 6B so that the fluorescent resin 35 can be omitted. FIG. 6A shows the case where only the substrate surface of the light-emitting device 10 is covered with the fluorescent layer 37. FIG. 6B shows the case where the surface of the substrate and the side surfaces of the light-emitting device 10 are covered with the fluorescent layer 37. According to the aspect shown in FIG. 6B, the wavelength of light emitted laterally from the side surfaces of the light-emitting device 10 can be converted by the fluorescent materials 36.

A light-transmissible material (such as epoxy resin, silicone resin, urea resin, glass or the like) containing the fluorescent materials 36 dispersed therein can be used as the fluorescent layer 37. In this case, the fluorescent layer 37 can be formed, for example, by dipping the substrate side of the light-emitting device 10 in such a light-transmissible material. Alternatively, the fluorescent layer 37 may be formed by sputtering, application, coating, or the like, using the light-transmissible material containing the fluorescent materials 36 dispersed therein.

The fluorescent layer 37 may be formed from a plate material obtained by processing Ca—Al—Si—O—N oxynitride glass activated with $Eu^{2+}$ (hereinafter referred to as "fluorescent material glass"). In the case shown in FIG. 6A, the fluorescent layer 37 is formed by the following method. That is, in the process of producing the light-emitting device 10, there may be used a method in which, after each semiconductor layer is formed on a substrate, flat plate-like fluorescent material glass is bonded to the substrate surface side and then the resulting product is separated into respective chips. Alternatively, there may be used a method using a substrate in which fluorescent material glass is bonded to a surface side opposite to the surface on which the semiconductor layer is grown in advance. Further, there may be used a method in which a fluorescent material glass plate with a desired size is bonded to the substrate surface of the light-emitting device 10 after the light-emitting device 10 is produced.

Similarly, in the case shown in FIG. 6B, for example, fluorescent material glass molded into a desired shape is prepared so that the substrate side of the light-emitting device 10 can be embedded into the fluorescent material glass to form the fluorescent layer 37. On this occasion, the light-emitting device 10 and the fluorescent material glass may be bonded to each other by an adhesive agent.

Figure 7:
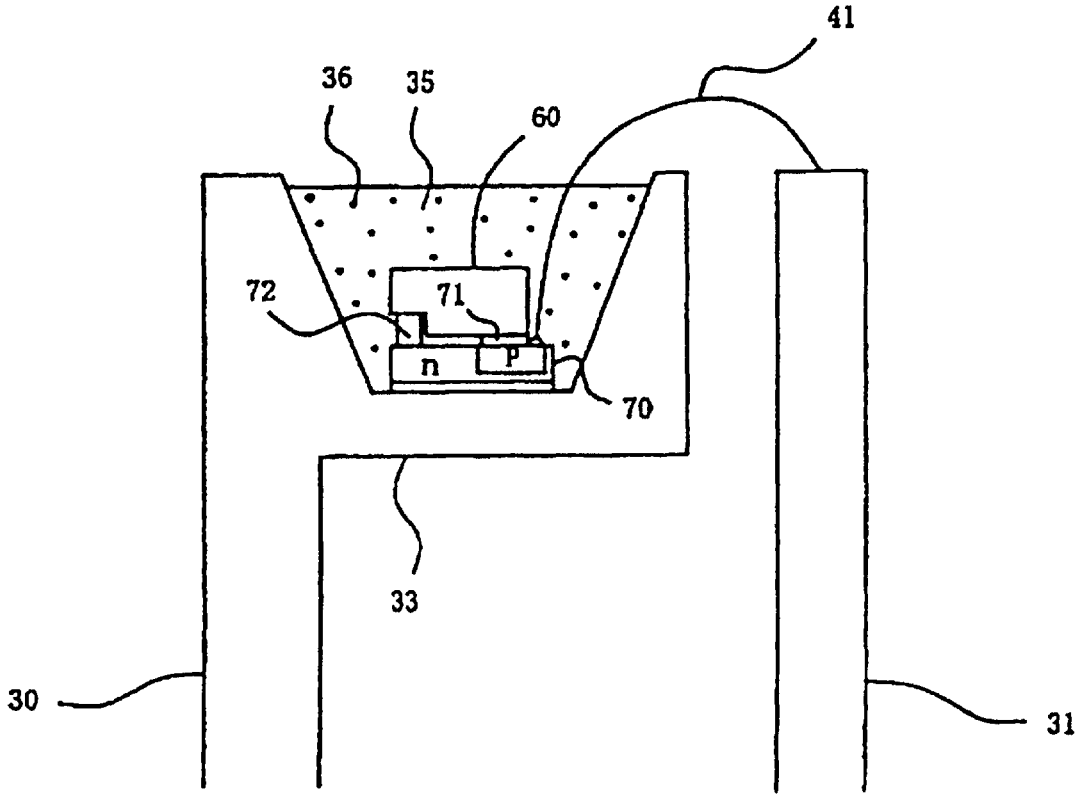
FIG. 7 is a partly enlarged view showing an example in which a planar type Zener light-emitting device 60 is used in the LED unit 1 of Embodiment 1.

In the LED unit 1, a planar type Zener light-emitting device may be used as the light-emitting device. FIG. 7 shows the case where a planar type Zener light-emitting device 60 is used. Incidentally, FIG. 7 is a partly enlarged view of the cup portion 33 of the mount lead 30.

The light-emitting device 60 is obtained by removing the electrodes 17, 18 and 19 from the light-emitting device 10 shown in FIG. 2. The light-emitting device 60 is fixed onto a silicon substrate 70 in the form of a flip chip. The p-type GaN contact layer 15 of the light-emitting device 10 is connected to the p-type region of the silicon substrate 70 through a metal electrode layer 71. The material of the metal electrode layer 71 is not particularly limited so long as ohmic contact can be obtained between the silicon substrate 70 and the p-type GaN contact layer 15. For example, a gold alloy or the like can be used. The n-type GaN contact layer 13 of the light-emitting device 10 is connected to the n-type region of the silicon substrate 70 through a metal electrode layer 72. The material of the metal electrode layer 72 is not particularly limited so long as ohmic contact can be obtained between the silicon substrate 70 and the n-type GaN contact layer 13. For example, an aluminum alloy or the like can be used. The p-type portion of the silicon substrate 70 is connected to the lead frame 31 by a wire 41.

Figure 8A:
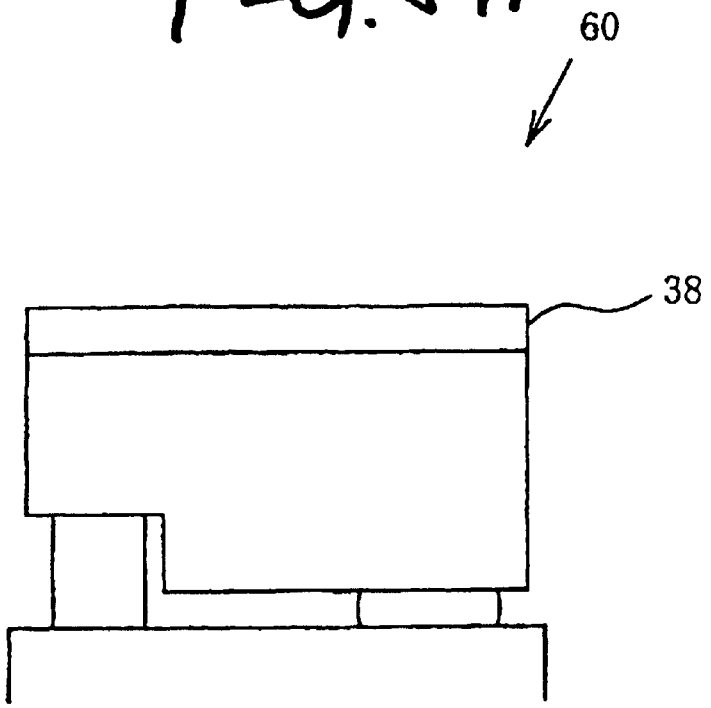
FIGS. 8A and 8B are views showing examples in each of which a fluorescent layer 38 is formed in the planar type Zener light-emitting device 60 so that the substrate is covered with the fluorescent layer.
Figure 8B:
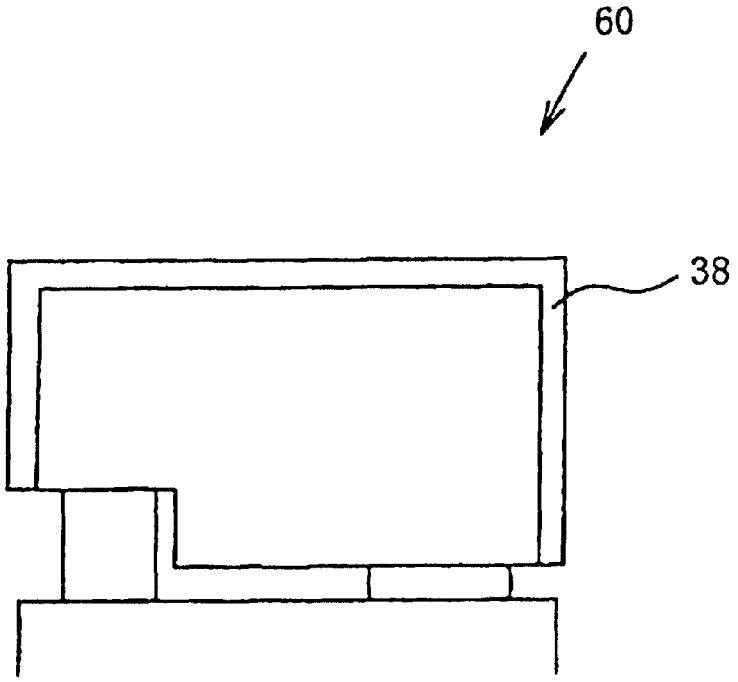

Also in the case where such a planar type Zener light-emitting device 60 is used, the cup portion 33 is filled with the fluorescent resin 35 containing the fluorescent materials 36 dispersed in the cup portion 33. Like the case where the light-emitting device 10 is used, the fluorescent resin 35 in the cup portion 33 may be omitted so that the fluorescent materials 36 are contained in the sealing resin 50. Alternatively, as shown in FIG. 8A or 8B, a fluorescent layer 38 may be provided so that the substrate surface of the light-emitting device 60 is covered with the fluorescent layer 38. FIG. 8A shows the case where only the substrate surface is covered with the fluorescent layer 38. FIG. 8B shows the case where the surface of the substrate and the side surfaces of the light-emitting device 60 are covered with the fluorescent layer 38. According to the aspect shown in FIG. 8B, the wavelength of light emitted laterally from the side surfaces of the light-emitting device 60 can be converted by the fluorescent materials 36.

The fluorescent layer 38 shown in FIG. 8A or 8B can be formed from the same material as that of the fluorescent layer 37 in the same method as in the fluorescent layer 37.

(Embodiment 2)

Figure 9:
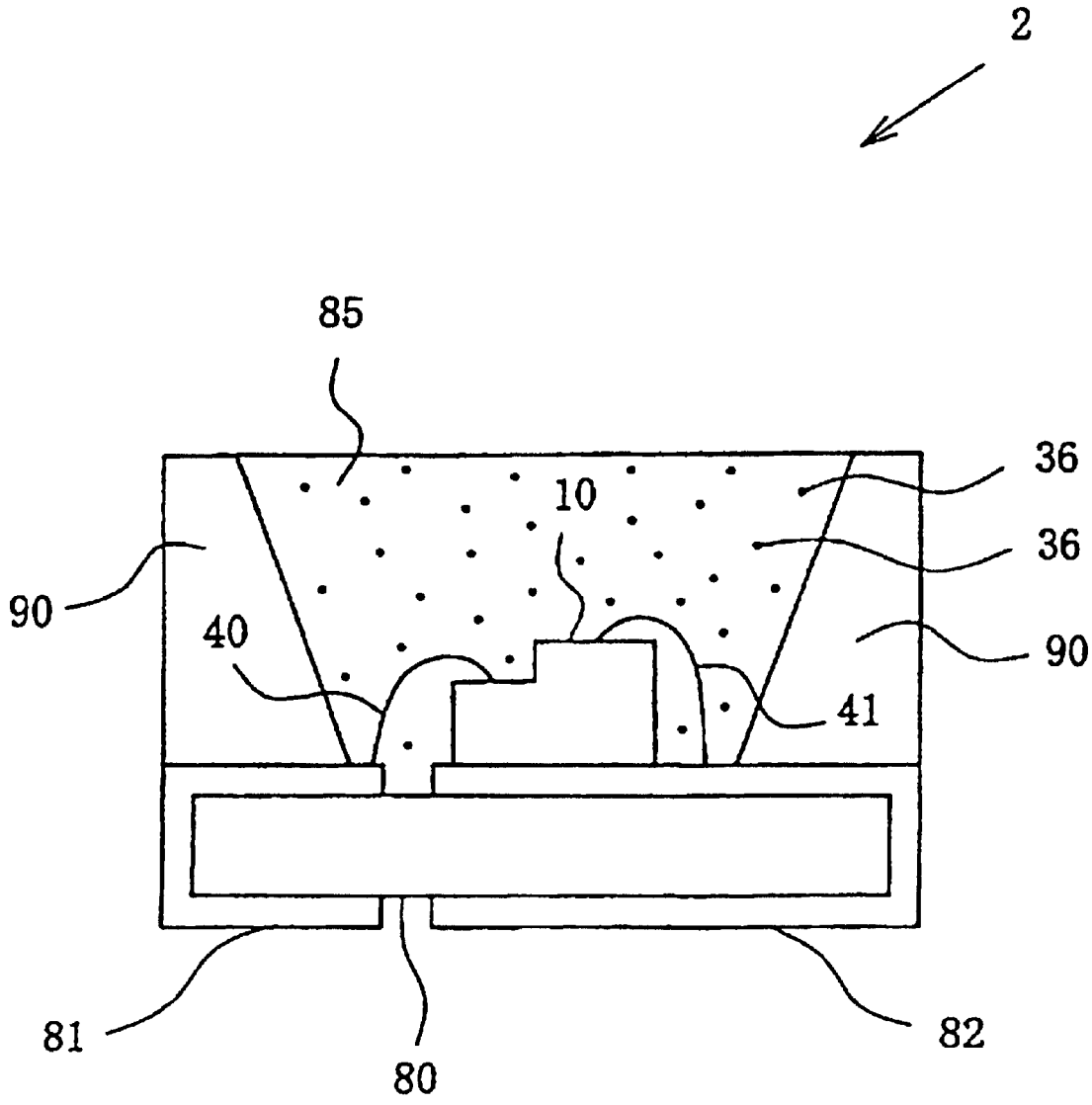
FIG. 9 is a view showing a chip type LED 2 which is another embodiment of the present invention.

FIG. 9 is a sectional view of a chip type LED unit 2 which is another embodiment of the present invention. In this embodiment, parts the same as those of the LED unit 1 in Embodiment 1 are referenced correspondingly, and the description of the parts will be therefore omitted. Also the LED unit 2 emits white light similarly to Embodiment 1. For example, the LED unit 2 may be combined with a light guide so that it can be used for a plane light source or a linear light source or used for any kind of display device or the like.

The light-emitting device 10 is fixed to a substrate 80 by use of silver paste or the like. Wires 40 and 41 connect electrodes of the light-emitting device 10 to electrodes 81 and 82, respectively, provided on the substrate 80. The reference numeral 90 designates a reflection plate formed around the light-emitting device. The surface of the reflection plate is planished as a mirror surface.

A cup-like portion formed by the substrate 80 and the reflection plate 90 is filled with a sealing resin 85. The light-emitting device 10 and the wires 40 and 41 are covered with the sealing resin 85. The sealing resin 85 is constituted by a fluorescent resin which contains a transparent base material such as an epoxy resin, a silicone resin or a urea resin, and fluorescent materials 36 dispersed evenly into the transparent base material. For example, the sealing resin 85 is formed by a method such as potting, printing, or the like.

In the LED unit 2 configured as described above, when light emitted from the light-emitting device 10 passes through the sealing resin 85, a part of the light is absorbed by the fluorescent materials 36 and the wavelength of the part of light is converted. The part of light which has been subjected to wavelength conversion is mixed with the other part of light which has not been absorbed by the fluorescent materials 36 but transmitted through the sealing resin 85, so that emission of white light as a whole is obtained.

Figure 10:
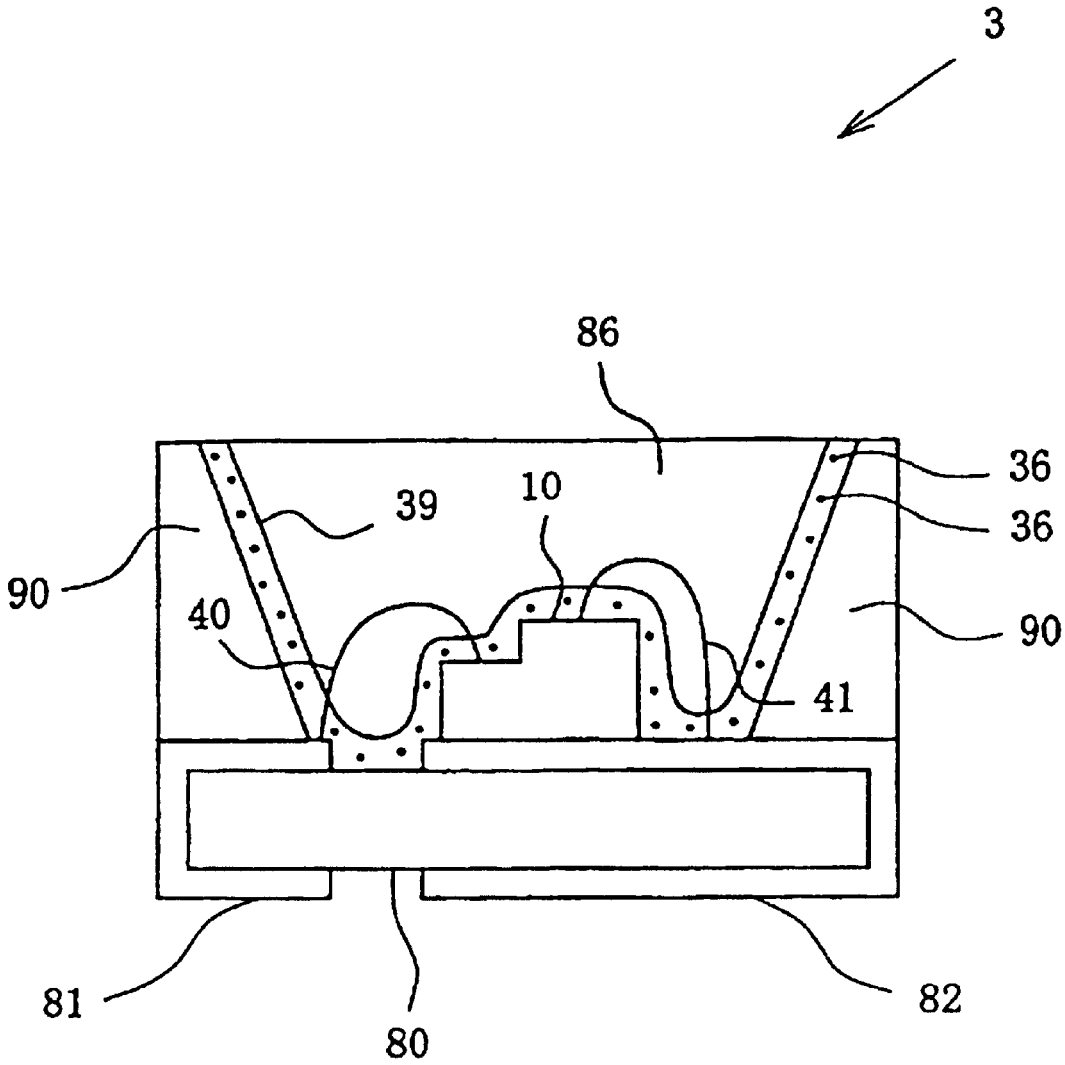
FIG. 10 is a view showing a chip type LED 3 similarly.

Although FIG. 9 shows the configuration in which the cup-like portion formed by the substrate 80 and the reflection plate 90 is filled with the sealing resin 85 constituted by a fluorescent resin, there may be used another configuration in which a layer 39 (fluorescent layer) of a fluorescent resin is provided on a surface of the light-emitting device 10 and a light-transmissible resin layer 86 is laminated on the layer 39 as shown in FIG. 10. For example, after the light-emitting device 10 is mounted on the substrate 80, the fluorescent layer 39 is formed by a method such as vapor deposition, sputtering, application, coating or the like. The light-transmissible resin layer 86 can be formed in the same manner as the sealing resin 85. According to the aforementioned configuration, the quantity of light which is emitted from the light-emitting device 10 and which is subjected to wavelength conversion by the fluorescent materials 36 can be adjusted by suitably designing the thickness of the fluorescent layer, so that the emission color of the LED unit 2 can be adjusted. Further, the layer containing the fluorescent materials 36 is covered with the light-transmissible resin layer 86, so that protection of the fluorescent materials 36 is attained.

Incidentally, similarly to the case of the LED unit 1 in Embodiment 1, one member selected from the group consisting of a diffusing agent, a coloring agent and an ultraviolet absorbing agent, or two or more members selected optionally from the aforementioned group may be contained in the sealing resin 85 of the LED unit 2 in FIG. 9 and in the fluorescent layer 39 and the light-transmissible resin layer 86 in the LED unit 3 in FIG. 10.

Figure 11:
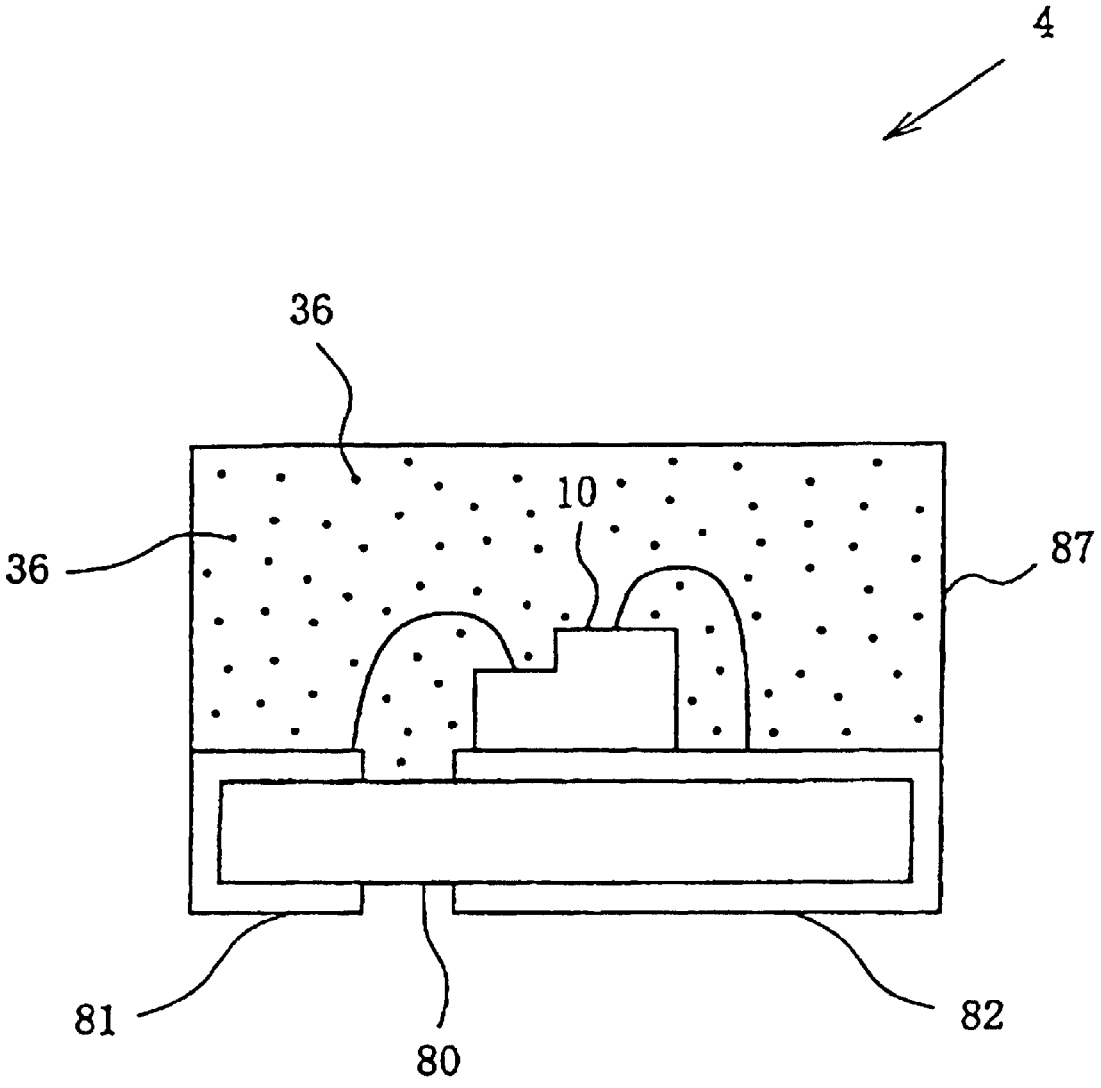
FIG. 11 is a view showing a chip type LED 4 similarly.

A configuration in which the reflection plate 90 is omitted may be adopted in the LED unit 2 in FIG. 9. FIG. 11 shows a chip type LED unit 4 configured as described above. Parts the same as those of the LED unit 2 are referenced correspondingly. The sealing member 87 of the LED unit 4 is constituted by an epoxy resin containing fluorescent materials 36 dispersed therein. After the light-emitting device 10 is mounted on the substrate 80, the sealing member 87 can be formed by molding into a desired shape.

Figure 12:
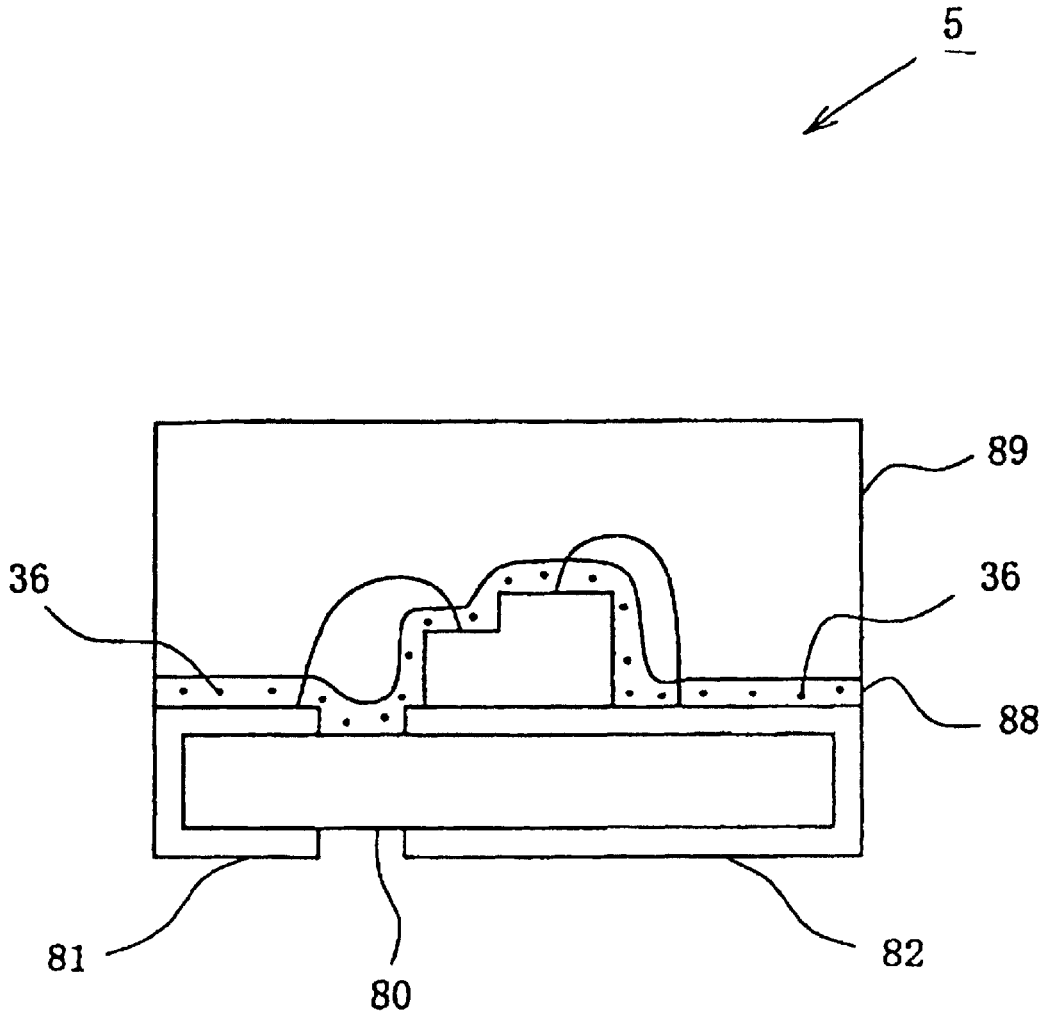
FIG. 12 is a view showing a chip type LED 5 similarly.

Similarly, a configuration (chip type LED unit 5) in which the reflection plate 90 is omitted as shown in FIG. 12 may be adopted in the LED unit 3 in FIG. 10. The fluorescent layer 88 can be formed in the same manner as the fluorescent layer 39 in the LED unit 3. The light-transmissible resin layer 89 can be also formed in the same manner as the light-transmissible resin layer 86 in the LED unit 3.

In each of the chip type LED units 2 to 5, a light-emitting device 10 having a fluorescent layer 37 shown in FIG. 6A or 6B on a surface of the substrate can be used. Further, a planar type Zener light-emitting device 60 shown in FIG. 8A or 8B may be used. In these cases, the fluorescent materials 36 in the sealing members 85 and 87 may be omitted in the chip type LED units 2 and 4, and the fluorescent layers 39 and 88 maybe omitted in the chip type LED units 3 and 5.

(Embodiment 3)

Figure 13:
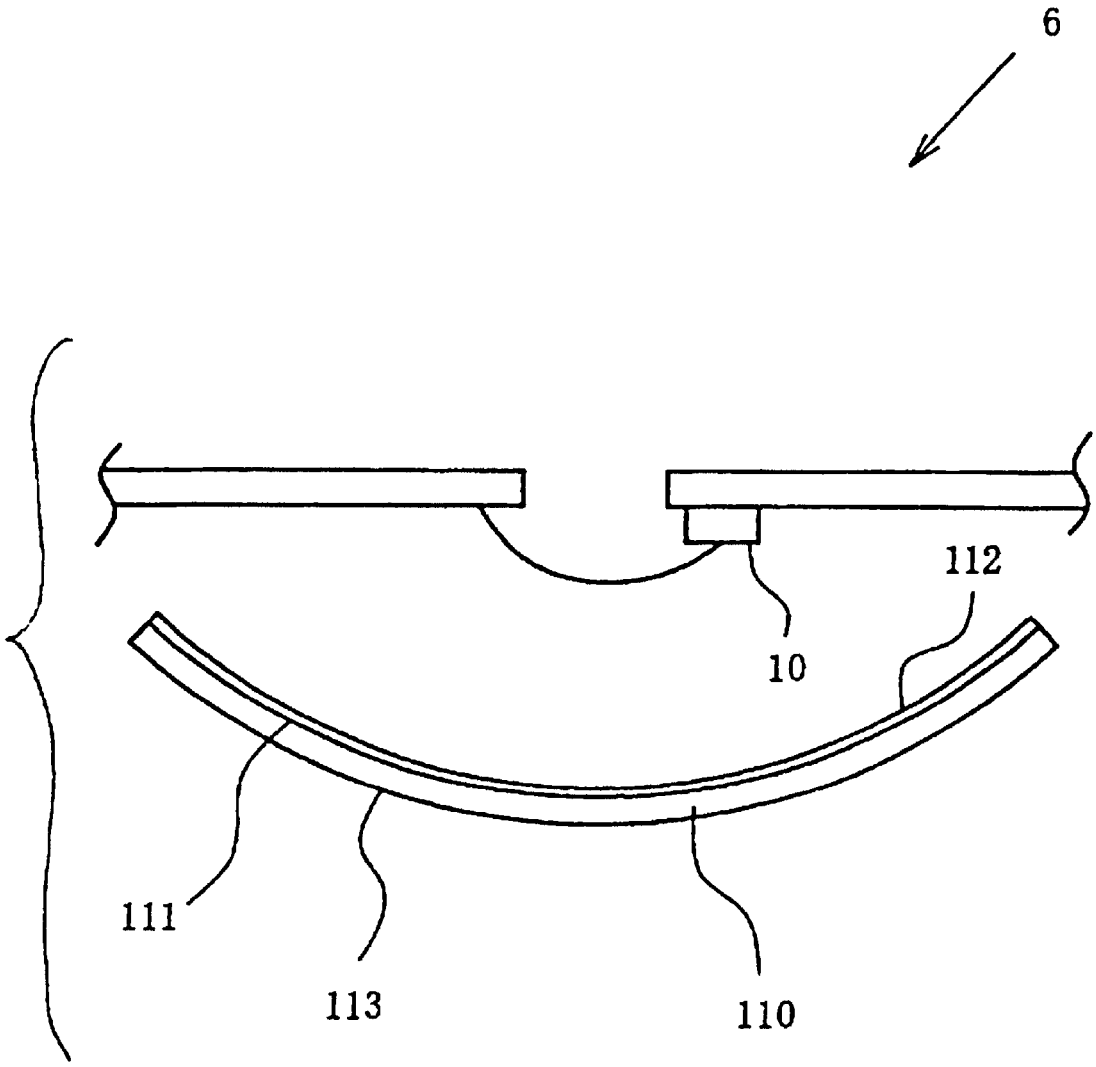
FIG. 13 is a view showing a reflection type LED 6 which is a further embodiment of the present invention.

FIG. 13 is a schematic configuration view of a reflection type LED unit 6 which is a further embodiment of the present invention. In this embodiment, parts the same as those of the LED unit 1 in Embodiment 1 are referenced correspondingly, and the description of the parts will be therefore omitted.

In the reflection type LED unit 6, a fluorescent layer 112 is formed on a concave surface 111 of a reflection mirror 110. The fluorescent layer 112 is constituted by an epoxy resin containing fluorescent materials 36. The fluorescent layer 112 is formed by application of the epoxy resin onto the concave surface 111. Besides the epoxy resin, a light-transmissible material such as a silicone resin, a urea resin, or the like, may be used. The method of forming the fluorescent layer 112 is not limited to application. For example, a method such as vapor deposition, coating, or the like, may be used.

Incidentally, the fluorescent materials may be formed on a convex surface 113 of the reflection mirror 110. In this case, the reflection mirror 110 is made from a light-transmissible material and the surface of the fluorescent layer is planished as a mirror surface. For example, a layer of a metal with a high reflection efficiency is formed by a method such as vapor deposition, plating, or the like.

In the reflection type LED unit 6 configured as described above, when the light emitted from the light-emitting device 10 is reflected by the reflection mirror 110, a part of the light is absorbed by the fluorescent materials in the fluorescent layer 112 and the wavelength of the part of light is converted. The part of light which has been subjected to wavelength conversion is mixed with the other part of light which has been reflected but not subjected to wavelength conversion, so that white light as a whole is radiated.

Incidentally, the light-emitting device 10 and the reflection mirror 110 maybe sealed with a light-transmissible material containing fluorescent materials instead of the provision of the fluorescent layer 112 on the concave surface 111 of the reflection mirror 110. Further, fluorescent material glass shaped like a reflection mirror may be used. In this case, the convex surface of the reflection mirror is planished as a mirror surface. The planishing method is the same as described above. Further, a light-emitting device having a fluorescent layer shown in FIG. 6A, 6B, 8A or 8B may be used. In this case, the fluorescent layer 112 on the surface of the reflection mirror can be omitted.

(Embodiment 4)

Figure 14A:
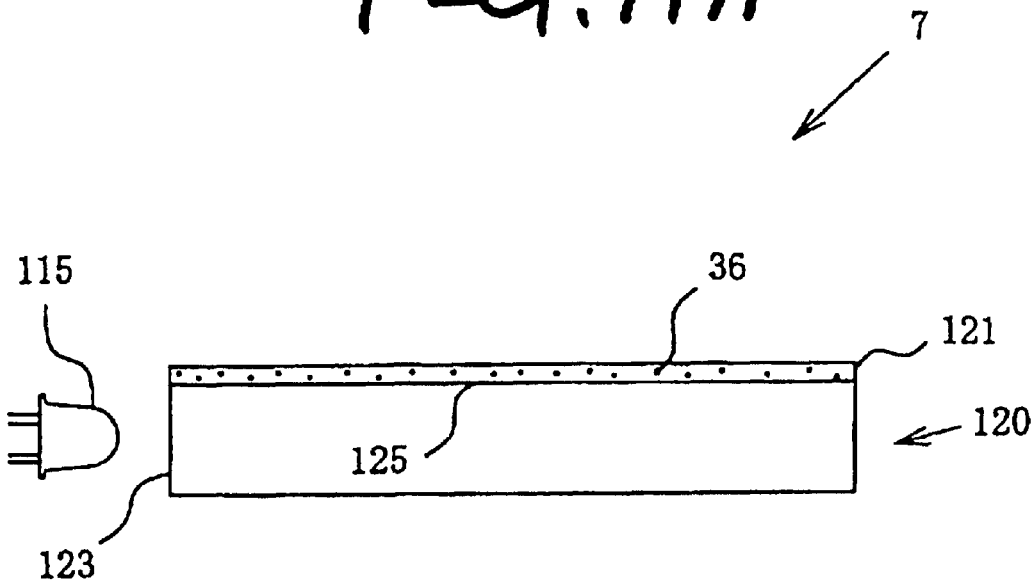
FIGS. 14A and 14B are views showing a plane light source 7 which is a further embodiment of the present invention.
Figure 14B:
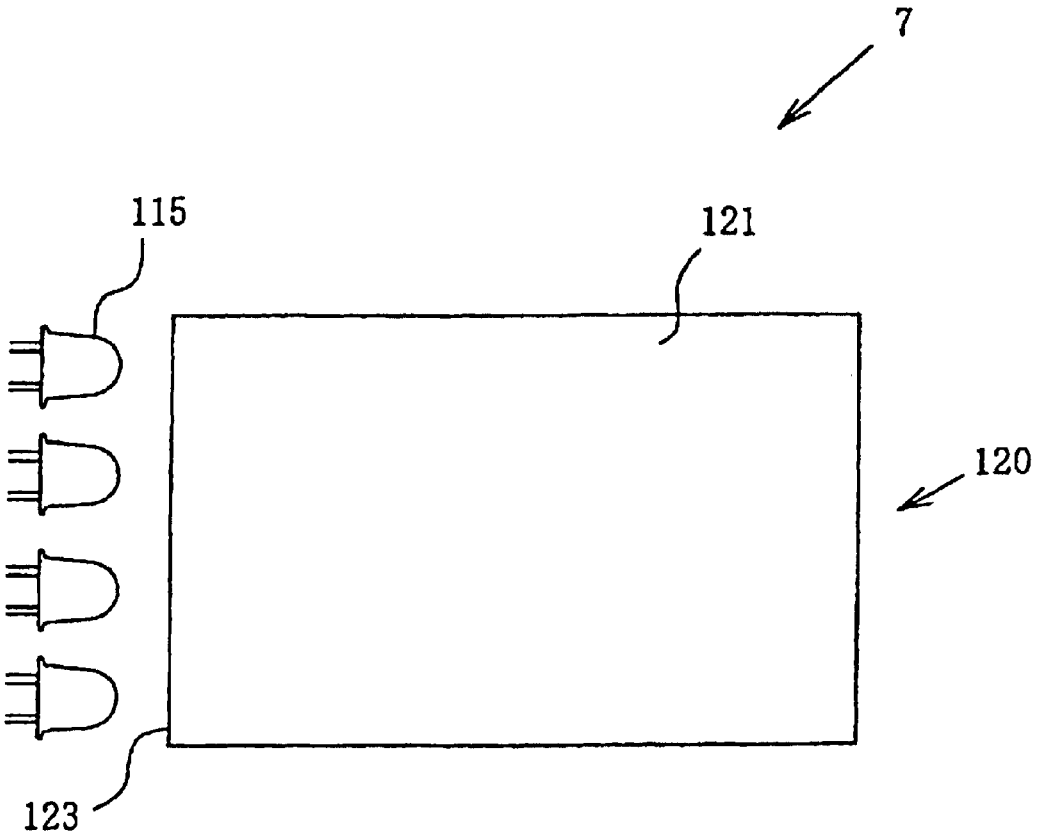

FIGS. 14A and 14B show a plane light source 7 which is a further embodiment of the present invention. FIG. 14A is a side view of the plane light source 7. FIG. 14B is a top view of the plane light source 7 (viewed from the fluorescent layer side). The plane light source 7 can be used as a liquid-crystal backlight in a personal computer, a portable telephone set, a portable information terminal or the like.

Figure 15:
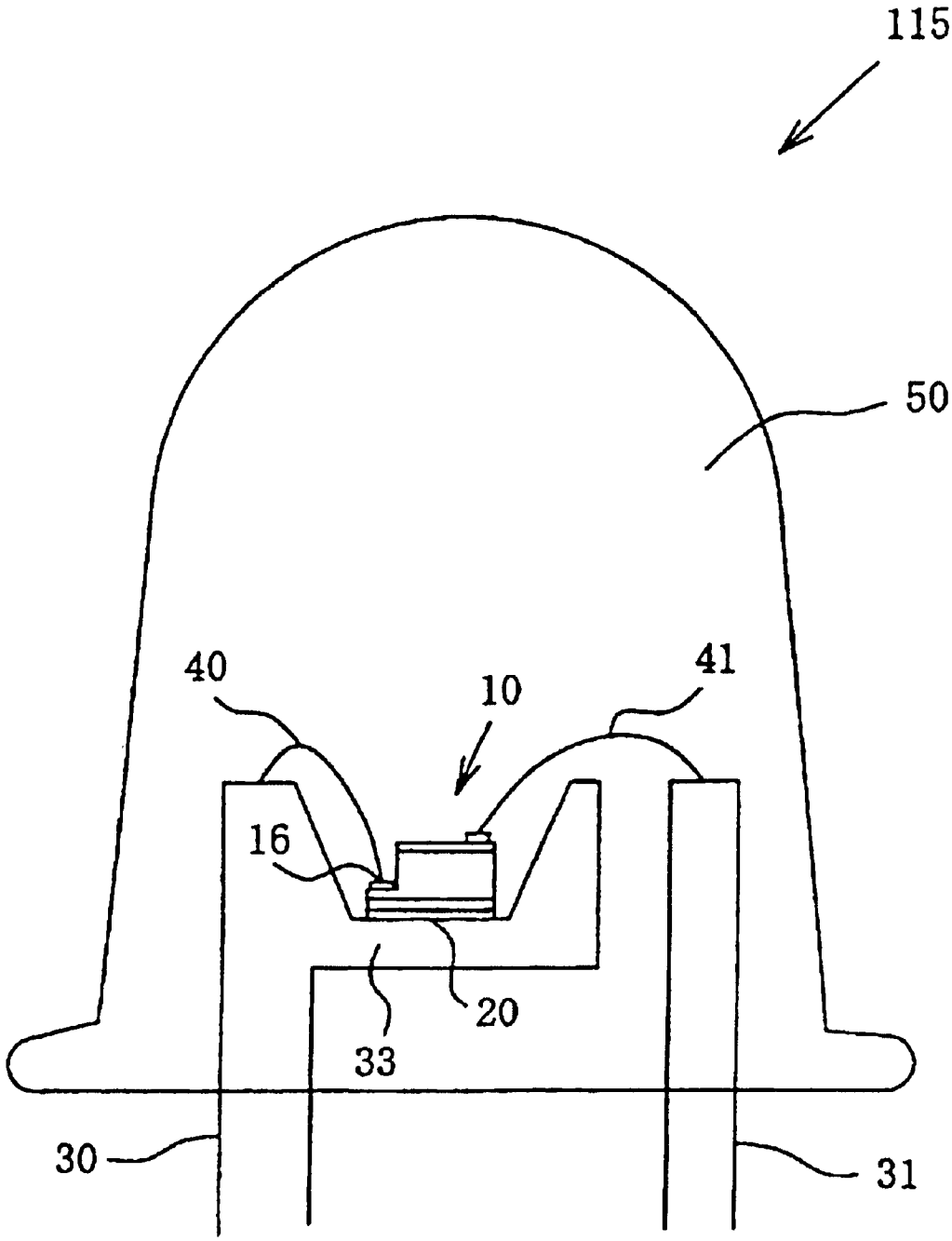
FIG. 15 is a schematic configuration view of an LED unit 115 used in the plane light source 7.

The plate light source 7 is constituted by a plurality of LED units 115, a light guide plate 120, and a fluorescent layer 121. FIG. 15 shows the schematic configuration of each LED unit 115. The LED unit 115 emits blue light. The LED unit 115 has a light-emitting device 10 in Embodiment 1, the light-emitting device 10 being mounted into a lead frame and sealed with a desired-shape epoxy resin. Respective layers in the light-emitting device 10 are configured as described above, and the description of the layers will be omitted.

The LED units 115 are disposed to face a light introduction surface 123 of the light guide plate 120. The number of the LED units 115 used is not particularly limited. Although this embodiment shows the case where round-type LED units 115 are used, other type (for example, chip type) LED units may be used. Further, the configuration of each light-emitting device is not limited to the light-emitting device described in this embodiment. For example, a planar type Zener light-emitting device may be used.

The light guide plate 120 is made from a light-transmissible material and has a light introduction surface 123 and a light-emitting surface 125. In this embodiment, a methacrylic resin is used as the light-transmissible material. Any other light-transmissible material such as polycarbonate or the like may be used.

The light guide plate 120 may contain a light-diffusing agent. Preferably, other surfaces of the light guide plate 120 than the light introduction surface 123 and the light-emitting surface 125 are covered with a reflection film or layer so that light is prevented from leaking out of the light guide plate 120. For example, a surface-roughening treatment is applied to the other surfaces than the light introduction surface 123 and the light-emitting surface 125 so that the other surfaces can exhibit light reflecting characteristics. Examples of the surface-roughening treatment method are etching, sandblasting, electric-discharge machining, and so on. The surface-roughening treatment may be replaced by white printing or white tape sticking to thereby form a light reflection layer. Preferably, the light reflection layer is formed so that the density of the light reflection layer is low in a region near to the LED units 115 but the density of the light reflection layer increases continuously or stepwise as the position goes farther from the LED units 115. Hence, efficient light reflection and diffusion can be made in a region distanced from the LED units 115. As a result, uniform light emission on the whole of the light-emitting surface 125 can be obtained regardless of the distance from the LED units 115.

Although this embodiment shows the case where one side surface is provided as a light introduction surface 123, a plurality of light introduction surfaces maybe provided. That is, LED units 115 may be provided to face the plurality of surfaces of the light guide plate 120 respectively so that light can be introduced into the light guide plate from the plurality of surfaces. According to the aforementioned configuration, the quantity of surface light obtained can be increased. Further, light can be radiated from a wider-range light-emitting surface. Further, the quantity of light radiation can be made more uniform all over the whole light-emitting surface.

The fluorescent layer 121 is made of an epoxy resin containing fluorescent materials 36 and a light-diffusing agent dispersed in the epoxy resin. The fluorescent layer 121 is formed so that the light-emitting surface 125 of the light guide plate 120 is covered with the fluorescent layer 121. The epoxy resin may be replaced by a methacrylic resin, a polycarbonate resin or the like. A granular material (mean grain size: 5 μm) of Ca—Al—Si—O—N oxynitride glass activated with $Eu^{2+}$ is used as the fluorescent materials 36.

Titanium oxide, titanium nitride, tantalum nitride, aluminum oxide, silicon oxide, barium titanate, or the like, may be used as the light-diffusing agent.

Although this embodiment shows the case where the fluorescent layer 121 is formed so that the light-emitting surface 125 is directly covered with the fluorescent layer 121, a space or a layer of a transparent material may be provided between the light-emitting surface 125 and the first fluorescent layer 121.

Incidentally, a coloring agent may be contained in the light guide plate 120 and/or the fluorescent layer 121 in order to perform color correction. Similarly to the fluorescent layer 121, the light guide plate 120 may contain a light-diffusing agent such as titanium oxide, titanium nitride, tantalum nitride, aluminum oxide, silicon oxide, barium titanate, or the like.

In the plane light source 7 configured as described above, blue light radiated from the LED units 115 is first introduced into the light guide plate 120 from the light introduction surface 123. The light enters the light guide plate 120 and is then radiated from the light-emitting surface 125. A part of the radiated light is absorbed by the fluorescent materials 36 in the fluorescent layer 121 and the wavelength of the part of the light is converted. The part of light which has been subjected to wavelength conversion is mixed with the other part of blue light which has not been subjected to wavelength conversion by the fluorescent materials, so that white surface light is radiated from the upper surface of the fluorescent layer 121. Because the light-diffusing agent is dispersed in the fluorescent layer 121, light mixing in the fluorescent layer 121 is accelerated to attain homogenization of light.

The fluorescent layer 121 may be replaced by a plate material obtained by processing fluorescent materials (Ca—Al—Si—O—N oxynitride glass activated with $Eu^{2+}$). That is, there may be used the configuration that plate-like fluorescent glass is mounted on the light-emitting surface 125 of the light guide plate 120. The fluorescent glass and the light guide plate 120 may be bonded to each other by an adhesive agent made from a light-transmissible material. Further, a sheet made from a light-transmissible material (such as a PET film) may be provided between the fluorescent glass and the light guide plate 120.

When the fluorescent materials are dispersed into the light guide plate 120, the fluorescent layer 121 can be omitted. Further, fluorescent glass processed into a plate-like shape may be used as the light guide plate 120 so that the fluorescent layer 121 can be omitted.

Incidentally, when other LED units with an emission wavelength different from that of the LED units 115 are used, white light different in color tone can be emitted. In addition to the LED units 115, LED units with an emission wavelength different from that of the LED units 115 may be used. In this case, when the ON state of each LED unit is controlled, the color of the emitted light can be corrected and adjusted so that the plane light source can be provided as a plane light source capable of emitting light with various colors.

(Embodiment 5)

Figure 16A:
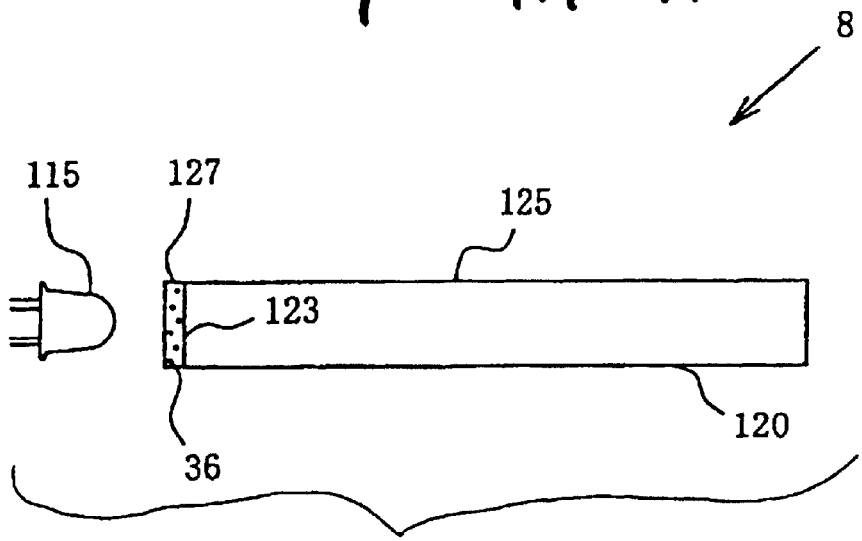
FIGS. 16A and 16B are views showing a plane light source 8 which is a further embodiment of the present invention.
Figure 16B:
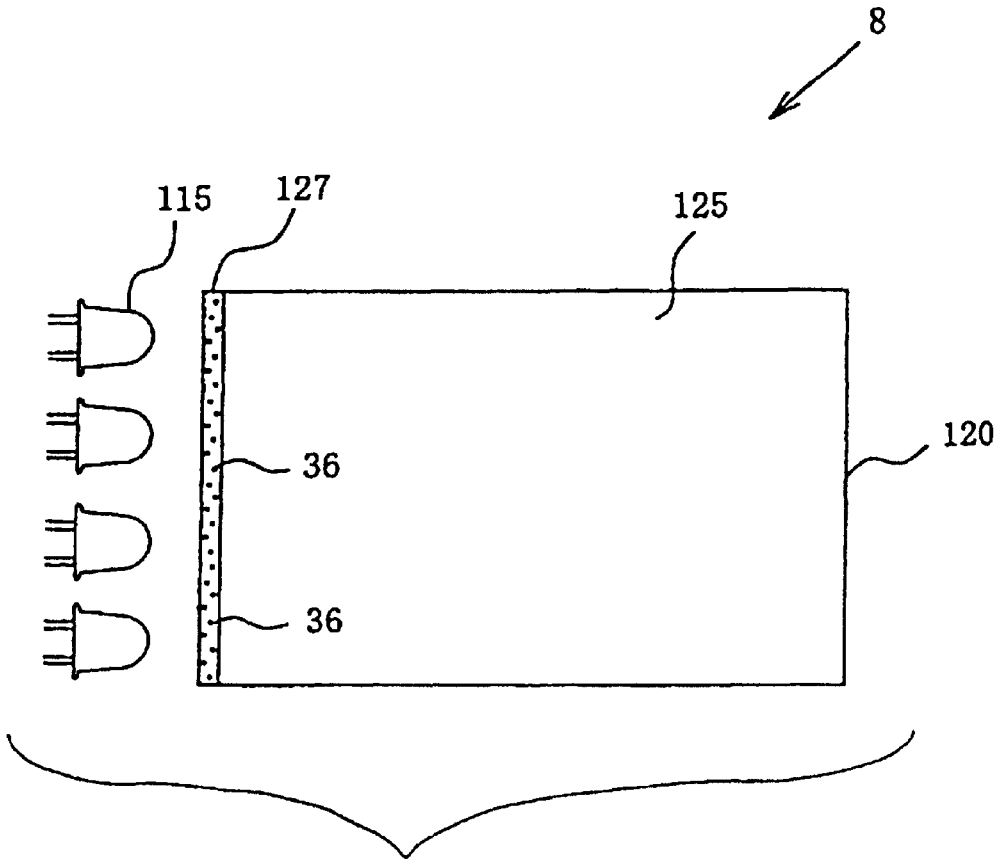

FIGS. 16A and 16B show a plane light source 8 which is an embodiment different from the aforementioned embodiment. Parts the same as those of the plane light source 7 are referenced correspondingly, and the description of the parts will be therefore omitted.

In the plane light source 8, a fluorescent layer 127 is disposed between a set of LED units 115 and the light introduction surface 123 of the light guide plate 120. The fluorescent layer 127 is configured in the same manner as the fluorescent layer 121 of the plane light source 7. Similar to the case of the plane light source 7, a space or a light-transmissible layer may be provided between the fluorescent layer 127 and the light introduction surface 123 of the light guide plate 120.

In the plane light source 8 configured as described above, a part of blue light radiated from the LED units 115 is absorbed by the fluorescent materials 36 in the fluorescent layer 127 and the wavelength of the part of light is converted. The part of light which has been subjected to wavelength conversion is mixed with the other part of blue light which has not been subjected to wavelength conversion by the fluorescent materials, so that the mixed light is introduced into the light guide plate 120 from the light introduction surface 123. The light entering the light guide plate 120 is finally radiated outward as white surface light from the light-emitting surface 125. Incidentally, light mixing may be performed also in the light guide plate 120.

(Embodiment 6)

Figure 17:
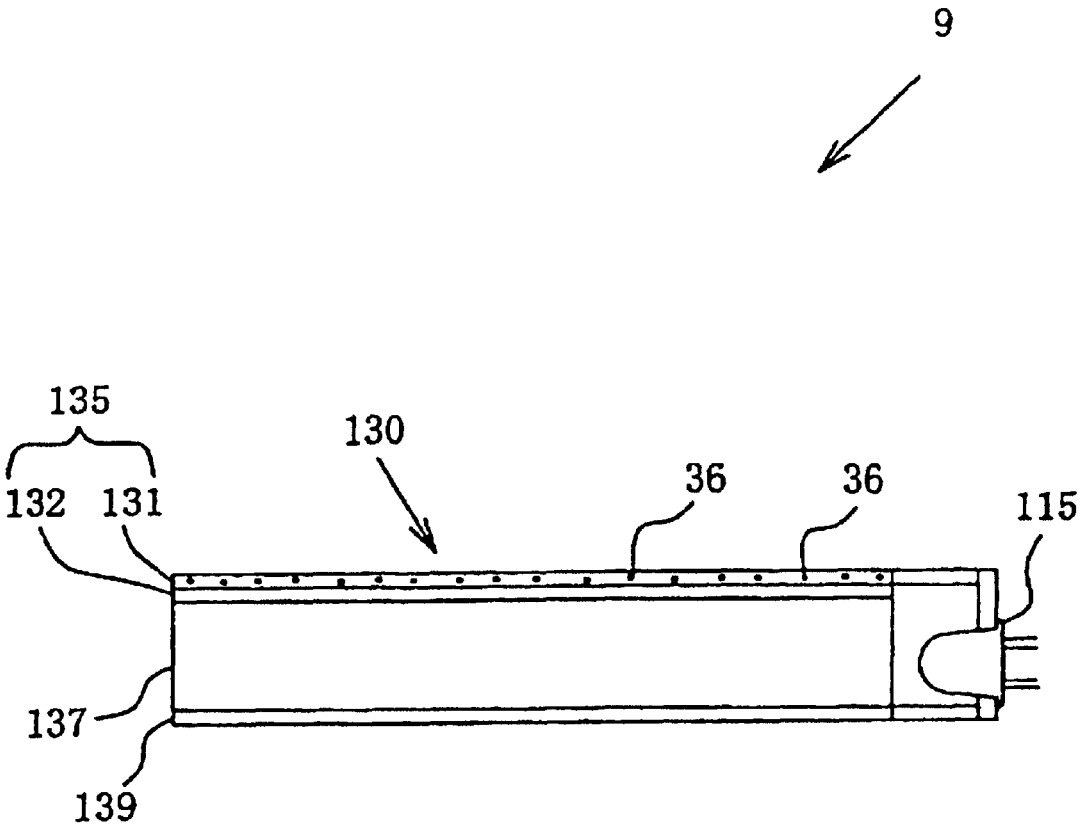
FIG. 17 is a view showing a plane light source 9 using a color conversion filter 130 which is a further embodiment of the present invention.

FIG. 17 shows a plane light source 9 using a color conversion filter 130. The color conversion filter 130 is constituted by a color conversion sheet 135, and a light guide layer 137. In this embodiment, parts the same as those of the aforementioned embodiment are referenced correspondingly, and the description of the parts will be therefore omitted.

The color conversion sheet 135 has a transparent sheet 132 made of a light-transmissible resin, and a fluorescent layer 131 formed on one surface of the transparent sheet 132. The fluorescent layer 131 is formed by having fluorescent materials 36 dispersed into a transparent base material such as an epoxy resin, a silicone resin or a urea resin.

PET is used as the material of the transparent sheet 132. Preferably, delicate roughness is given to a surface of the fluorescent layer 131. By the delicate roughness, the upper surface (surface of the fluorescent layer 131) of the color conversion sheet 135 is fitted to glass or the like disposed on the color conversion sheet 135 to thereby prevent smear from occurring in an interfacial surface between the color conversion sheet 135 and the glass. Further, delicate roughness is also preferably given to an adhesive surface between the transparent sheet 132 and the light guide layer 137. By the delicate roughness, the color conversion sheet 135 is prevented from adhering closely to the light guide layer 137 to thereby prevent smear from occurring in the interfacial surface between the color conversion sheet 135 and the light guide layer 137.

The light guide layer 137 is made of an epoxy resin. Of course, the light guide layer 137 may be made of any other transparent resin such as a silicone resin. A reflection layer 139 is formed on the lower surface of the light guide layer 137, so that light is prevented from leaking out of the lower surface of the light guide layer 137. The material of the reflection layer 139 is not particularly limited. Preferably, the same reflection layer as described above is provided on any other side surface than the surface where the LED units 115 are disposed oppositely. By the provision of the reflection layer, light is prevented from leaking out of the side surface. The reflection layer 139 may be omitted.

The LED units 115 are disposed in a position facing the side surface of the color conversion filter 130. Alternatively, the LED units 115 may be disposed in a position facing a lower surface of the color conversion filter 130. In this case, the reflection layer 139 is not provided on the lower surface.

The mode of light radiation in the plane light source 9 configured as described above is as follows. First, light emitted from the LED units 115 is introduced into the light guide layer 137 from a side surface of the light guide layer 137 and taken out from a surface (upper surface) on the color conversion sheet 135 side. The wavelength of a part of the light is converted by the fluorescent materials 36 when the light passes through the fluorescent layer 131. The part of light which has been subjected to wavelength conversion is mixed with the other part of light which has not been subjected to wavelength conversion by the fluorescent materials 36, so that white light as a whole can be radiated from the upper surface of the color conversion sheet 135.

Incidentally, when LED units with an emission wavelength different from that of the LED units 115 are used, white light different in color tone can be emitted. In addition to the LED units 115, LED units with an emission wavelength different from that of the LED units 115 may be used in combination. When the ON state of each LED unit is controlled, the color of emitted light can be corrected or adjusted. Moreover, the plane light source can be provided as a plane light source capable of emitting light with various colors.

(Embodiment 7)

Figure 18:
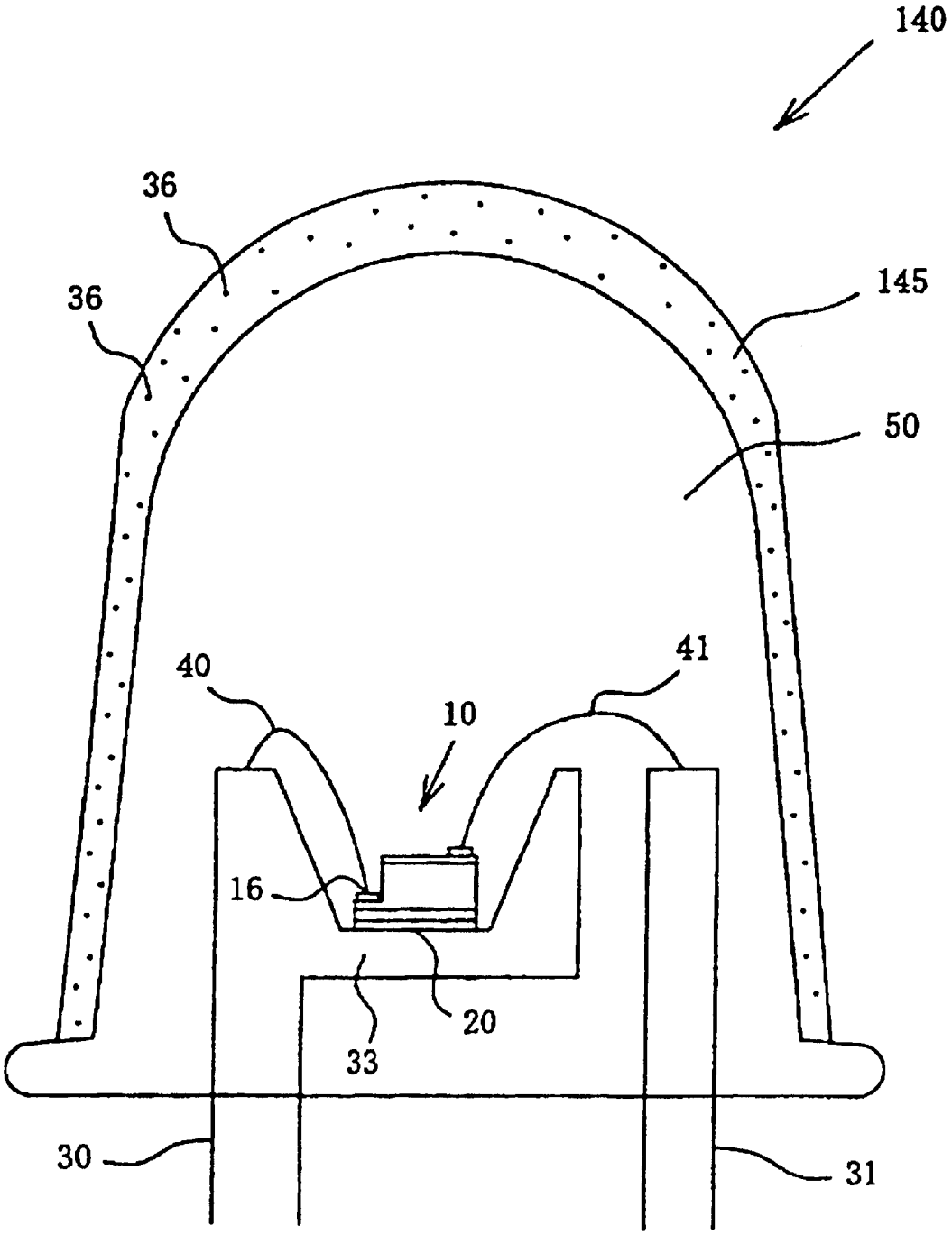
FIG. 18 is a view showing a cap type LED unit 140 which is a further embodiment of the present invention.

FIG. 18 is a view showing a cap type LED unit 140. In this embodiment, parts the same as those of the aforementioned embodiment are referenced correspondingly, and the description of the parts will be therefore omitted.

The LED unit 140 is configured so that the surface of the sealing resin 50 in the LED unit 115 of Embodiment 4 is covered with a cap 145 made of a light-transmissible resin containing fluorescent materials 36 dispersed therein. The cap 145 can be formed by molding a light-transmissible resin containing fluorescent materials 36 into a cap shape and by covering the sealing resin 50 with the cap-shape light-transmissible resin. Alternatively, the cap 145 may be formed by molding or the like after the sealing resin 50 is formed. In this embodiment, an epoxy resin is used as the material of the cap 145. Alternatively, a heat-curable resin such as a urea resin or a thermoplastic resin such as polyethylene may be used. The cap 145 may further contain a diffusing agent such as titanium oxide, titanium nitride, tantalum nitride, aluminum oxide, silicon oxide, barium titanate, etc.

In the LED unit 140 configured as described above, a part of light emitted from the light-emitting device 10 is converted in wavelength by the fluorescent materials 36 when the light passes through the cap 145. The part of light which has been subjected to wavelength conversion is mixed with the other part of blue light which has not been subjected to wavelength conversion by the fluorescent materials 36. As a result, white light is radiated outward from the surface of the cap 145.

(Embodiment 8)

FIGS. 19 to 24 show other examples to which the present invention is applied. Light-emitting units shown in FIGS. 19 to 24 will be described below. Incidentally, in this embodiment, parts the same as those in the aforementioned embodiment are referenced correspondingly, and the description of the parts will be therefore omitted.

Figure 19:
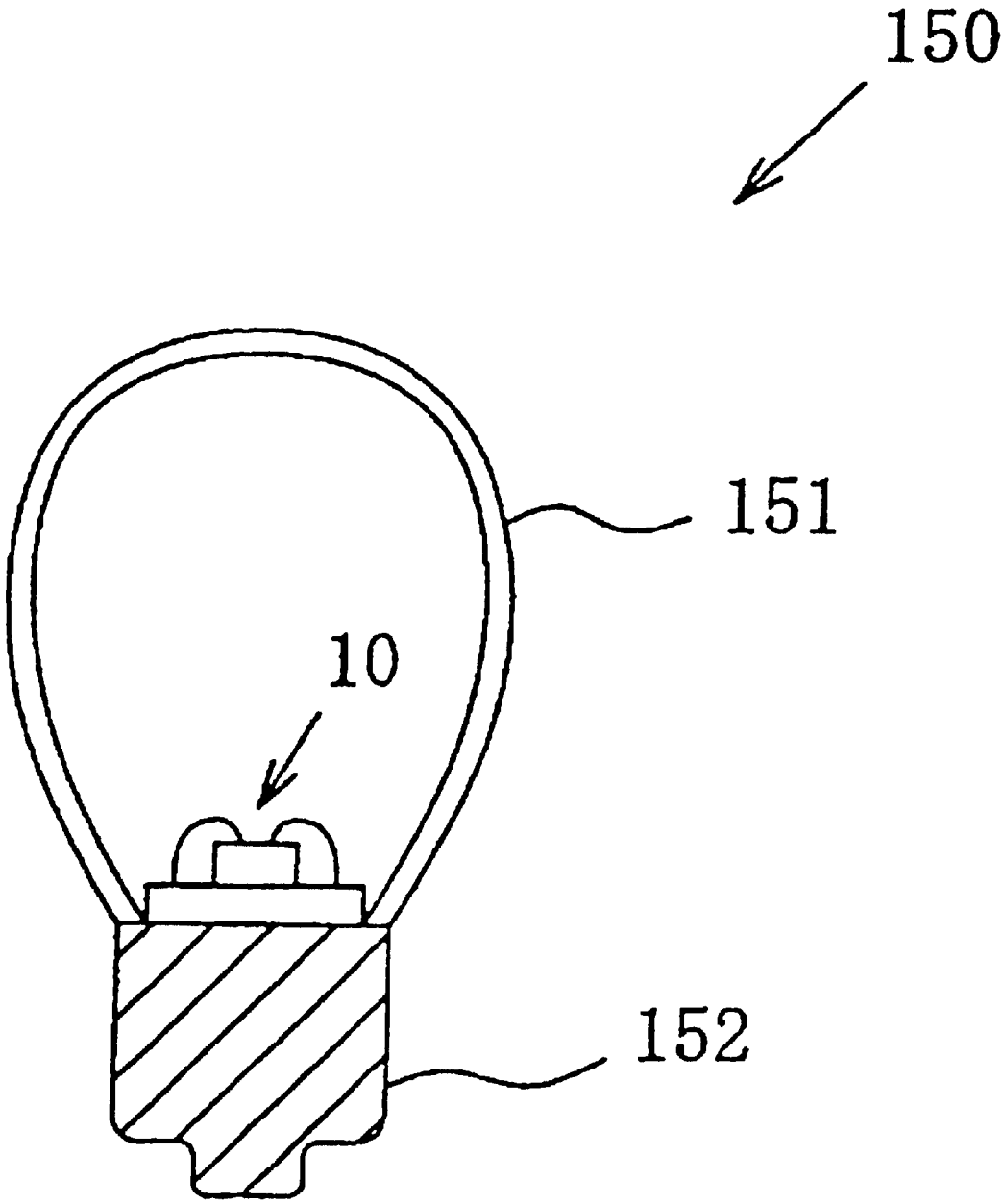
FIG. 19 is a view showing an electric bulb type light-emitting unit 150 which is a further embodiment of the present invention.

An electric bulb type light source unit 150 is shown in FIG. 19. The light source unit 150 schematically comprises a light-emitting device 10, fluorescent glass 151, and a casing portion 152. A current is supplied to the light-emitting device 10 through the casing portion 152. As shown in the drawing, the fluorescent glass 151 is formed by molding Ca—Al—Si—O—N oxynitride glass activated with $Eu^{2+}$ into a hollow substantially-spherical shape. In the light-emitting unit 150, when the light emitted from the light-emitting device passes through the fluorescent glass 151, a part of the light is absorbed by the fluorescent materials and the wavelength of the part of light is converted. The part of light which has been subjected to wavelength conversion is mixed with the other part of light which is emitted from the light-emitting device and which is transmitted through the fluorescent glass. As a result, the mixed light is radiated outward. Incidentally, the fluorescent glass may contain a coloring agent and/or a light-diffusing agent.

Figure 20:
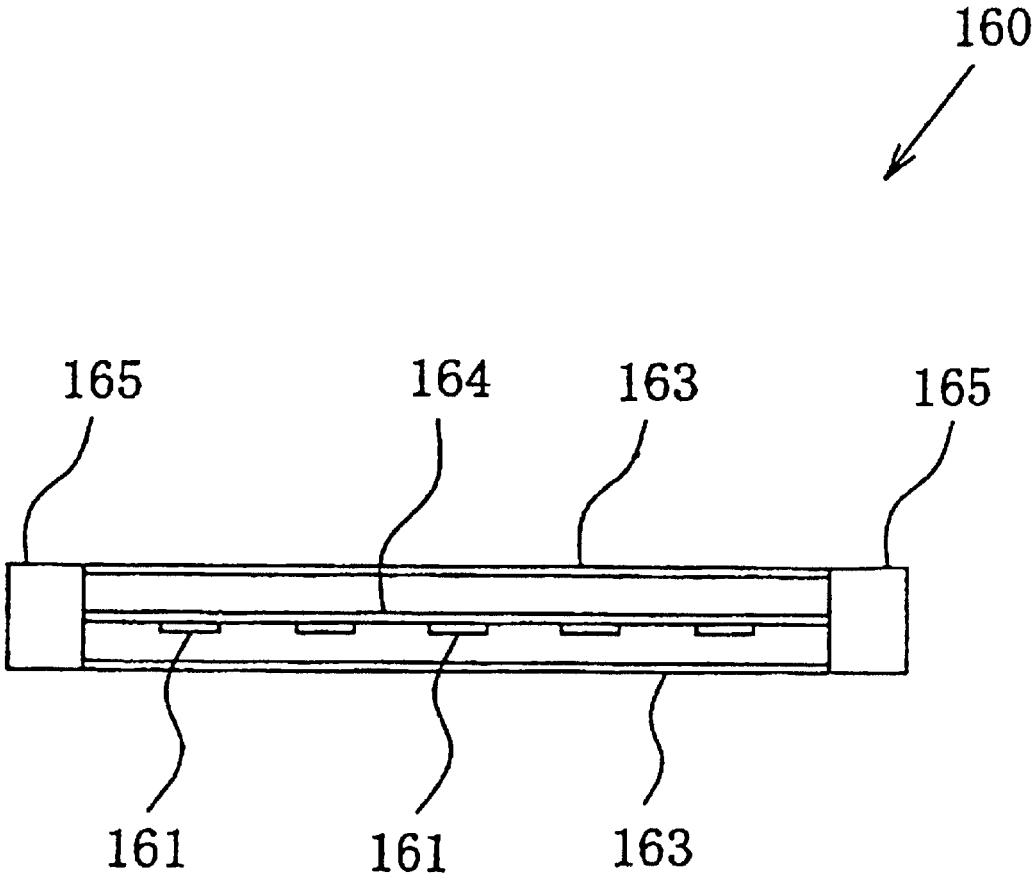
FIG. 20 is a view showing a fluorescent lamp type light-emitting unit 160 which is a further embodiment of the present invention.

A fluorescent lamp type light source unit 160 is shown in FIG. 20. The light source unit 160 schematically comprises a plurality of chip type LED units 161, tubular fluorescent glass 163, and casing portions 165. The respective LED units 161 are mounted on a substrate 164. A current is supplied to each LED unit 161 through the casing portions 165. The fluorescent glass 163 is the same as the fluorescent glass 151 except the shape. In the light-emitting unit 160, when the light emitted from the respective LED units 161 passes through the fluorescent glass 163, a part of the light is absorbed by the fluorescent materials and the wavelength of the part of light is converted. The part of light which has been subjected to wavelength conversion is mixed with the other part of light which is emitted from the LED units and which is transmitted through the fluorescent glass 163. As a result, the mixed light is radiated outward. As each LED unit 161, one capable of emitting light in a wavelength range of from 360 to 550 nm is used. When, for example, chip type LED units with an emission wavelength of 480 nm are used, emission of white light is obtained.

The chip type LED units may be replaced by round-type LED units. Further, the LED units may be used in combination with other type LED units substantially incapable of exciting the fluorescent materials for light emission.

Figure 21:
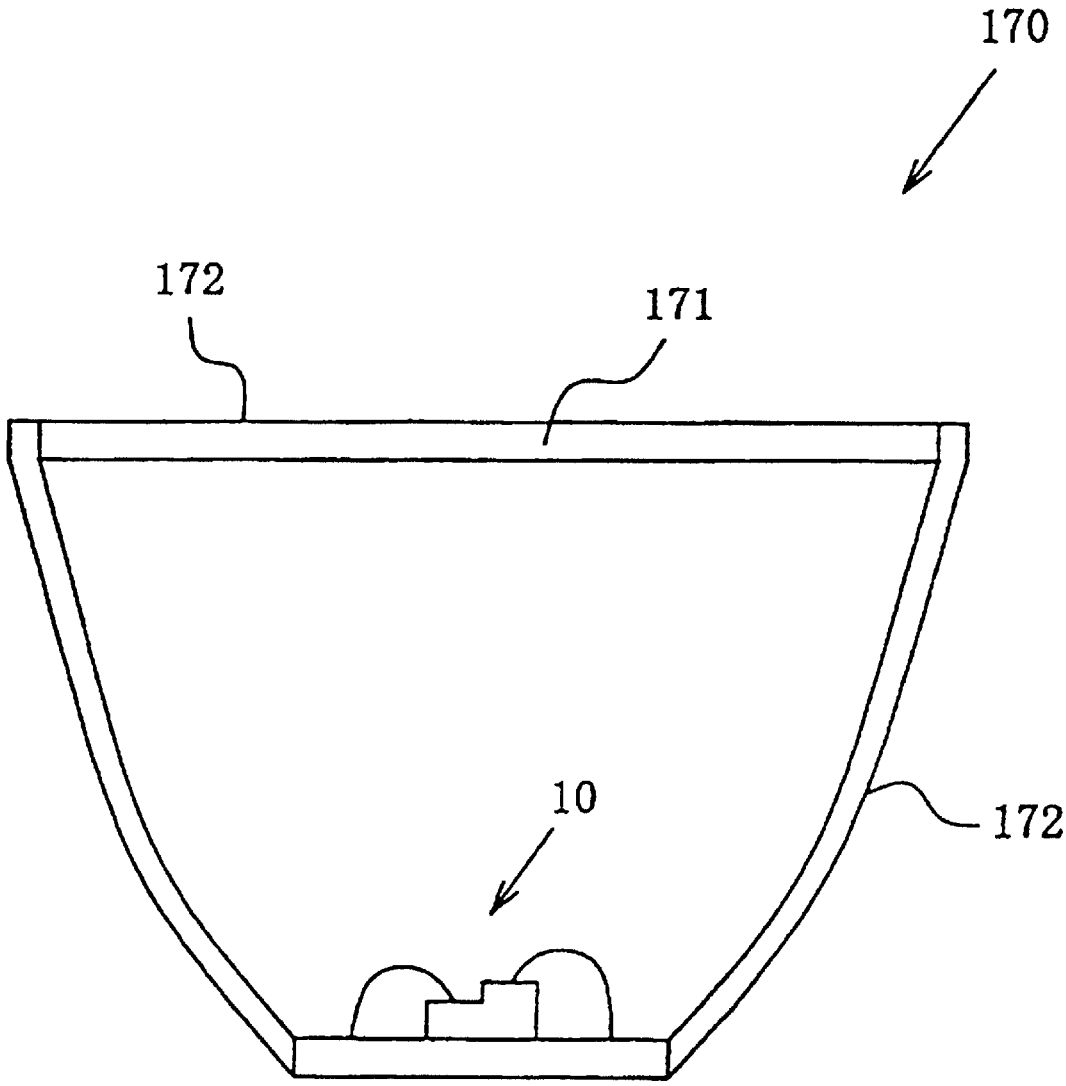
FIG. 21 is a view showing a Braun tube type light-emitting unit 170 which is a further embodiment of the present invention.

A Braun tube type light-emitting unit 170 is shown in FIG. 21. The light-emitting unit 170 comprises a light-emitting device 10, a fluorescent plate 171, and a casing 172 constituted by a material incapable of transmitting light. The fluorescent plate 171 is formed into a plate shape by processing fluorescent glass (Ca—Al—Si—O—N oxynitride glass activated with $Eu^{2'}$). In the aforementioned configuration, the wavelength of a part of light emitted from the light-emitting device 10 is converted in the fluorescent plate 171. The part of light which has been subjected to wavelength conversion is mixed with the other part of light which has not been subjected to wavelength conversion, so that the mixed light is radiated outward radially form the light-emitting surface 172 of the fluorescent plate 171. Hence, radial white light is obtained.

Figure 22:
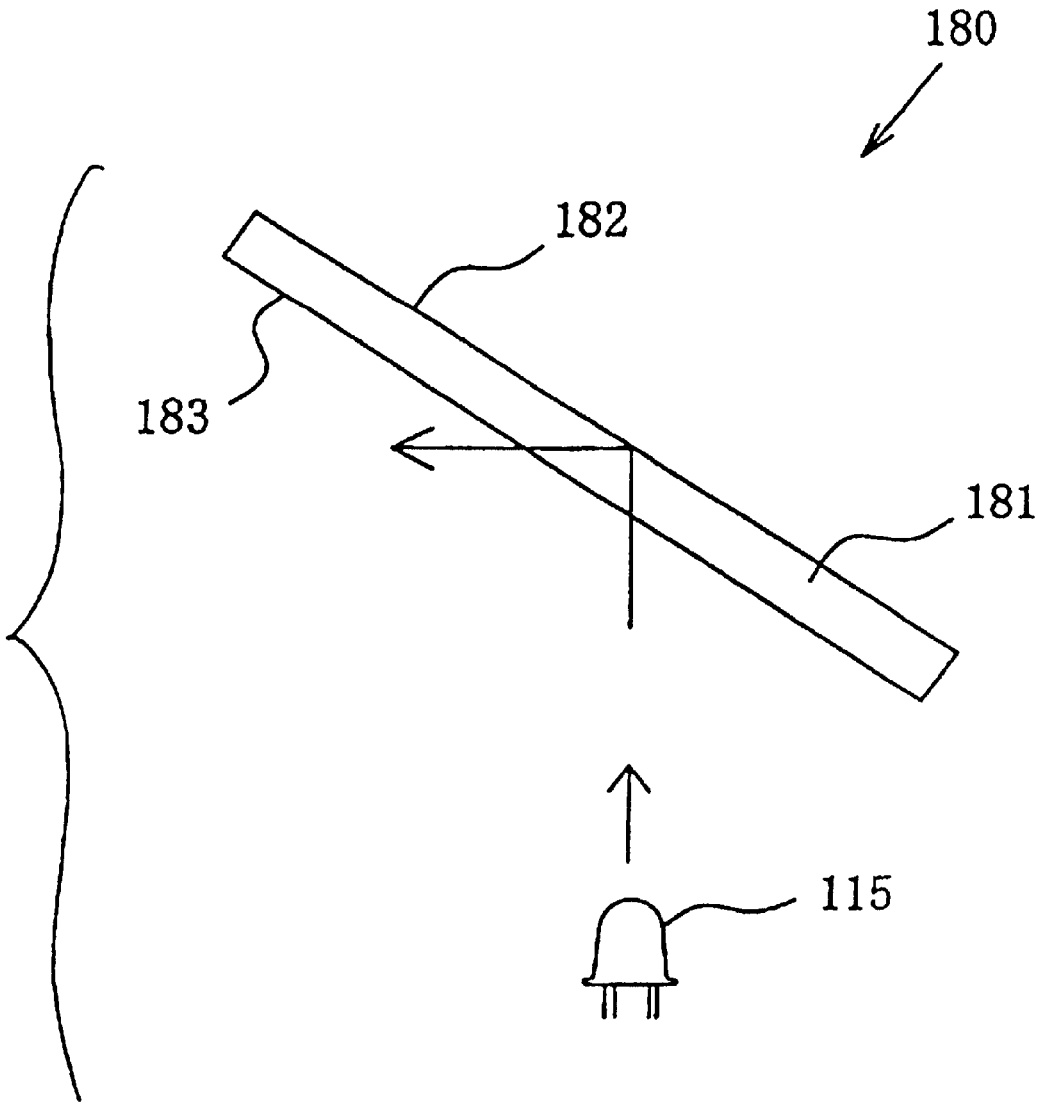
FIG. 22 is a view showing a projector type light-emitting unit 180 which is a further embodiment of the present invention.

A projector type light-emitting unit 180 is shown in FIG. 22. The light-emitting unit 180 comprises an LED unit 115, and a reflection plate 181. The reflection plate 181 is disposed with a predetermined inclination angle relative to the optical axis of the LED unit 115. In this embodiment, the reflection plate 181 is made from fluorescent glass (Ca—Al—Si—O—N oxynitride glass activated with $Eu^{2+}$). Alternatively, the reflection plate 181 may be made from a light-transmissible material (such as an acrylic resin) and a layer containing fluorescent materials (Ca—Al—Si—O—N oxynitride activated with $Eu^{2+}$) may be formed on a surface facing the LED unit. One surface 182 of the reflection plate 181 is planished as a mirror surface. For example, a planishing treatment is carried out by applying a high-reflectance metal onto the surface 182 by means of vapor deposition, plating, or the like.

In the light-emitting unit 180 configured thus, light emitted from the LED unit 115 reaches the reflection plate 181 and is reflected by the reflection surface 182. As a result, the light is radiated in a predetermined direction. A part of light emitted from the LED unit 115 is converted in wavelength in the reflection plate 181. The part of light which has been subjected to wavelength conversion is mixed with the other part of light which has not been subjected to wavelength conversion. As a result, the mixed light is radiated from the light-emitting surface 183.

Figure 23:
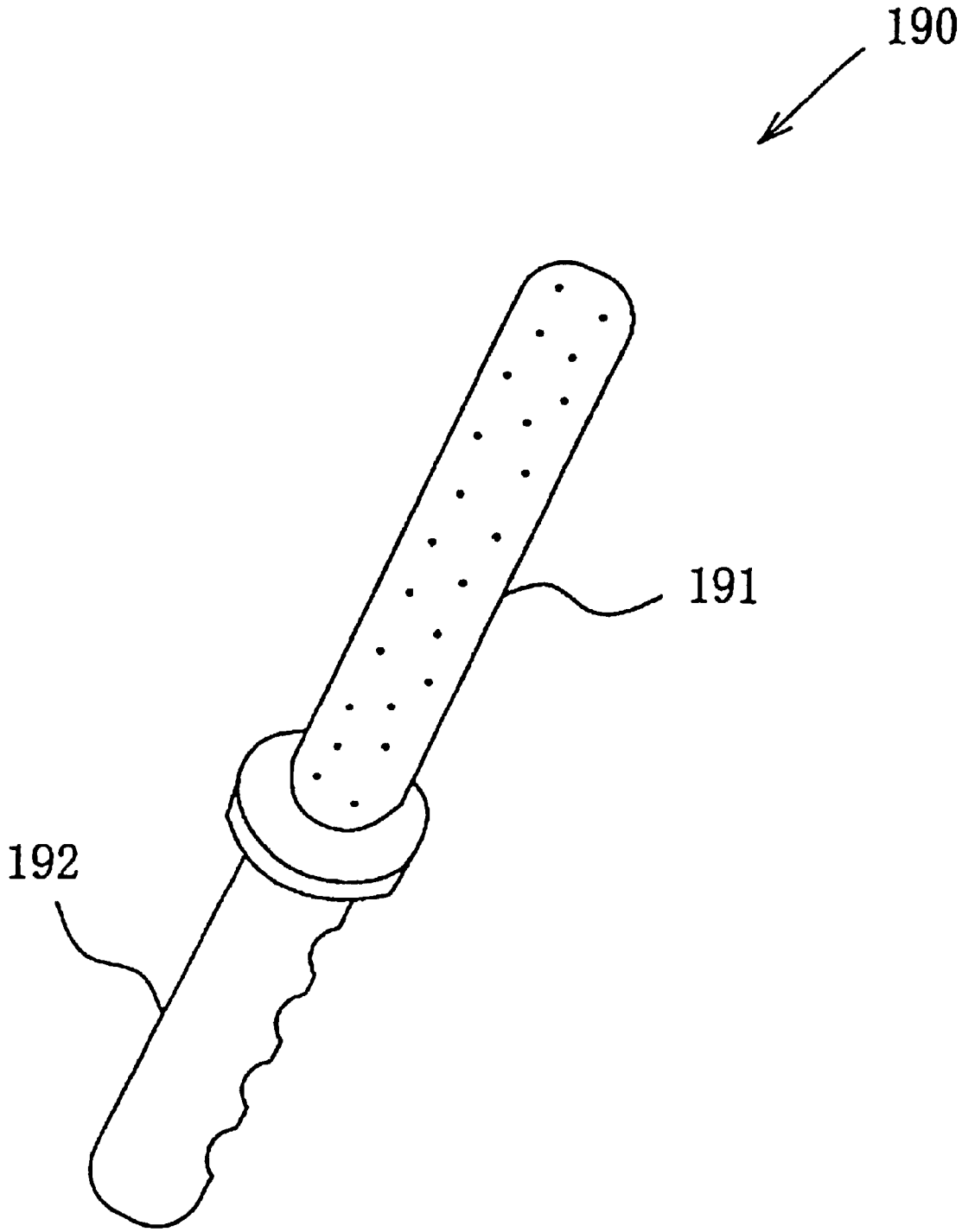
FIG. 23 is a view showing a light-emitting lamp 190 which is a further embodiment of the present invention.

A light-emitting lamp 190 is shown in FIG. 23. The light-emitting lamp 190 comprises a light-emitting portion 191, a grip portion 192, and LED units (not shown) contained in the grip portion. The light-emitting portion 191 is constituted by a member obtained by processing and molding an acrylic resin containing fluorescent materials 36 dispersed therein into a cylindrical shape. Two kinds of LED units, this is, a red LED unit and a blue LED unit are used. Each LED unit is connected to a control circuit and an electric source which are not shown. When the red LED unit is turned on, light emitted from the LED unit is directly radiated from a surface of the light-emitting portion 191. That is, the light-emitting portion 191 emits red light. On the other hand, when the blue LED unit is turned on, a part of light emitted from the LED unit is converted in wavelength by the fluorescent materials in the light-emitting portion. The part of light which has been subjected to wavelength conversion is mixed with the other part of light which is radiated but has not been subjected to wavelength conversion. As a result, the mixed light is radiated from the surface of the light-emitting portion 191. Hence, the light-emitting portion 191 emits white light. When, for example, the LED units are turned on alternately, red light and white light can be emitted alternately. Incidentally, the LED units used and the mode of turning-on of the LED units are not limited to the above description.

Figure 24A:
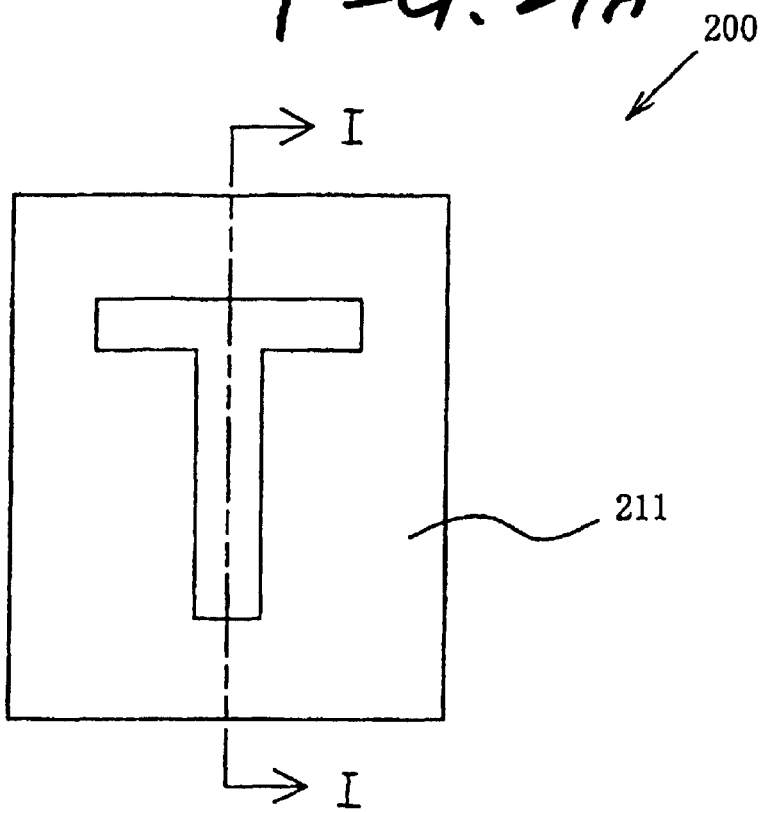
FIGS. 24A and 24B are views showing a display unit 200 which is a further embodiment of the present invention.
Figure 24B:
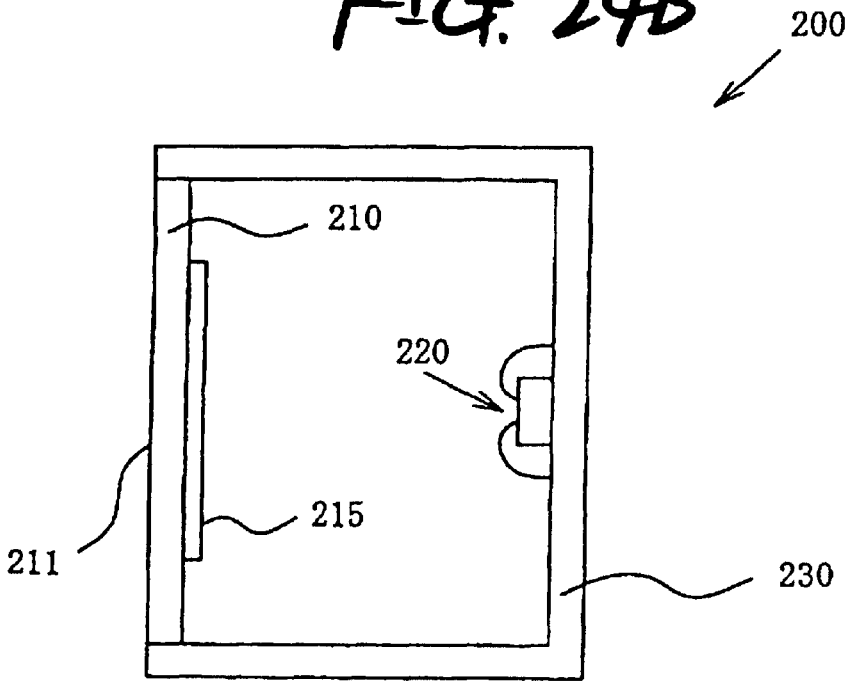

A display unit 200 capable of performing character display, or the like, is shown in FIGS. 24A and 24B. FIG. 24A is a view of a display portion 210 of the display unit 200 viewed from the display surface 211 side. FIG. 24B is a sectional view taken along the line I—I in FIG. 24A. The display unit 200 schematically comprises a display portion 210, an LED unit 220, and a frame 230.

Figure 25:
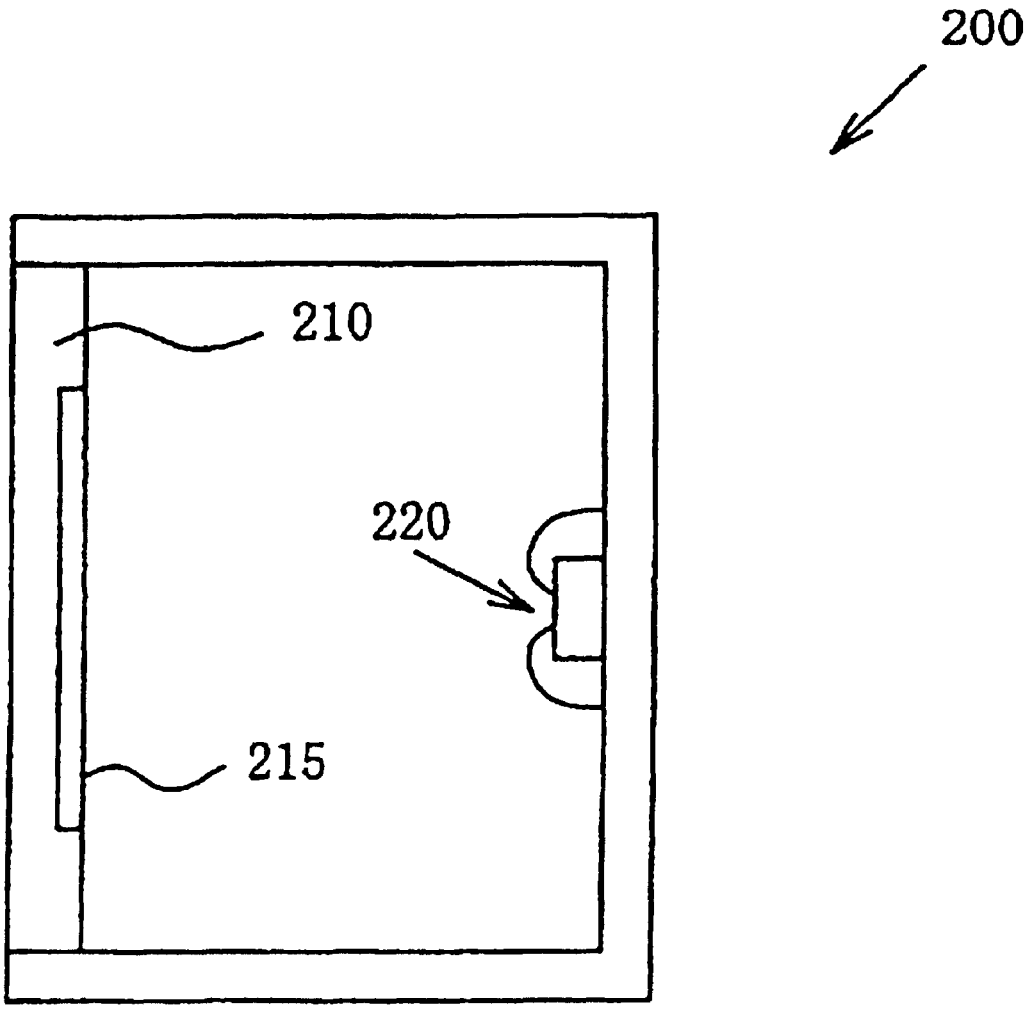
FIG. 25 is a view showing an example of the display unit 200 different in the condition of formation of the fluorescent layer 215.

The display portion 210 is made from a light-transmissible material (such as an acrylic resin). A fluorescent layer 215 is formed in a part of the rear surface of the display portion 210 so that a desired character, figure, or the like, is shaped. The fluorescent layer 215 is formed by providing fluorescent materials 36 dispersed into a light-transmissible material. Alternatively, the fluorescent layer 215 may be made from fluorescent glass (Ca—Al—Si—O—N oxynitride glass activated with $Eu^{2+}$). Further, the fluorescent layer 215 may be formed so as to be embedded into the display portion 210 as shown in FIG. 25. The LED unit 220 is an LED unit capable of emitting blue light.

In the display unit 200, light emitted from one portion of the display surface 211 on the rear surface side of which the fluorescent layer 215 is formed is transmitted through the fluorescent layer 215 and radiated outward. That is, the light is mixed light of the light subjected to wavelength conversion by the fluorescent materials and the light not subjected to wavelength conversion. Hence, white light is radiated from the one portion. On the other hand, light emitted from the other portion of the display surface 211 of the LED unit is radiated directly without wavelength conversion. That is, blue light is radiated. In this manner, a portion of the display surface 211 can be displayed with white color and the other portion of the display surface 211 can be displayed with blue color. Hence, a desired character, figure, or the like, can be displayed.

(Embodiment 9)

Figure 26:
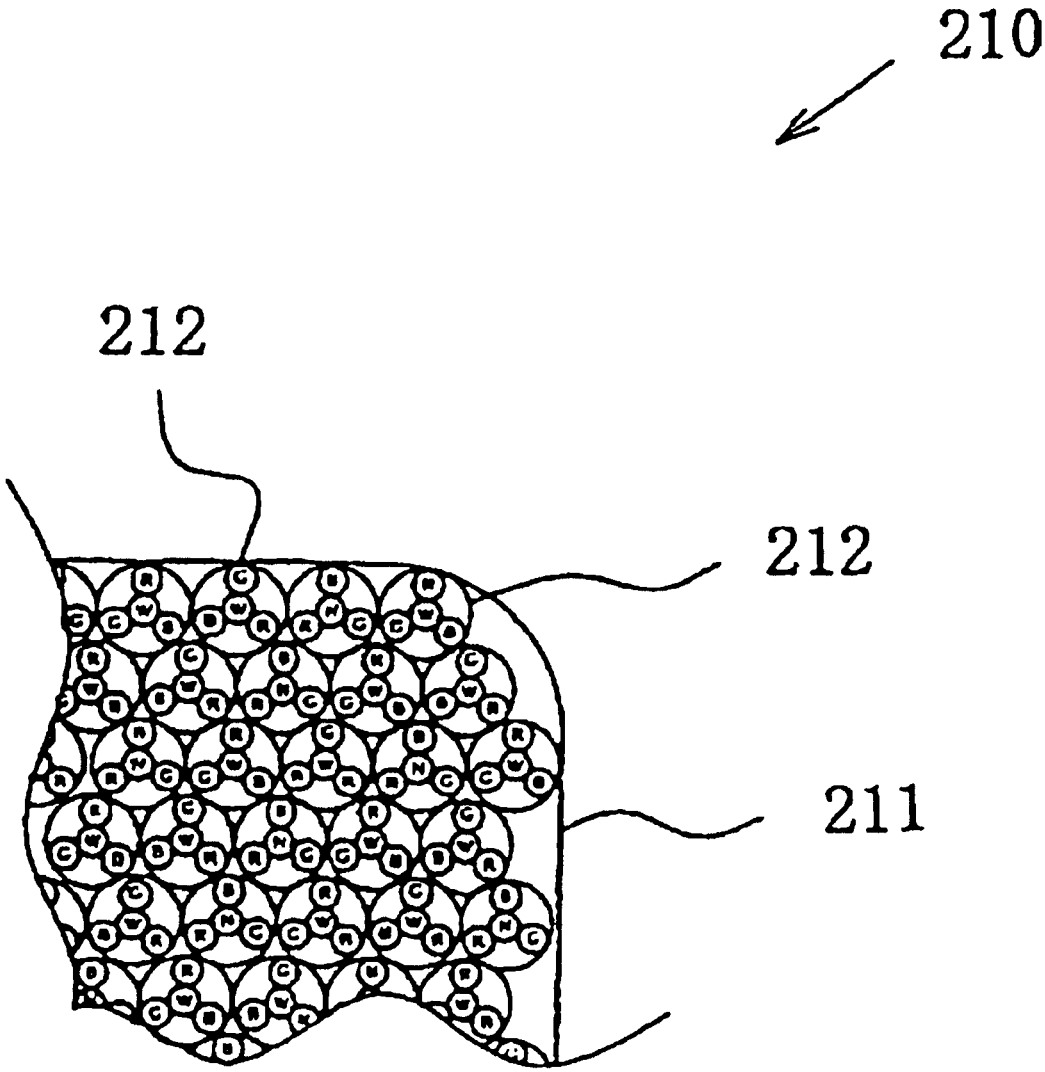
FIG. 26 is a view showing a display unit 210 using LEDs 1 which is a further embodiment of the present invention.

FIG. 26 is a partly enlarged view of a display unit 210 using LEDs 1 (hereinafter referred to as "W-LEDs") in Embodiment 1 in combination with RGB LEDs. The display unit 210 can be used as a full-color LED display or the like.

The display unit 210 has a schematically rectangular display portion 211. The display portion 211 has LED units 212 disposed in the form of a matrix. Each of the LED units 212 is constituted by a combination of RGB LEDs and a W-LED. The arrangement of respective LEDs in each LED unit 212 can be selected optionally.

Figure 27:
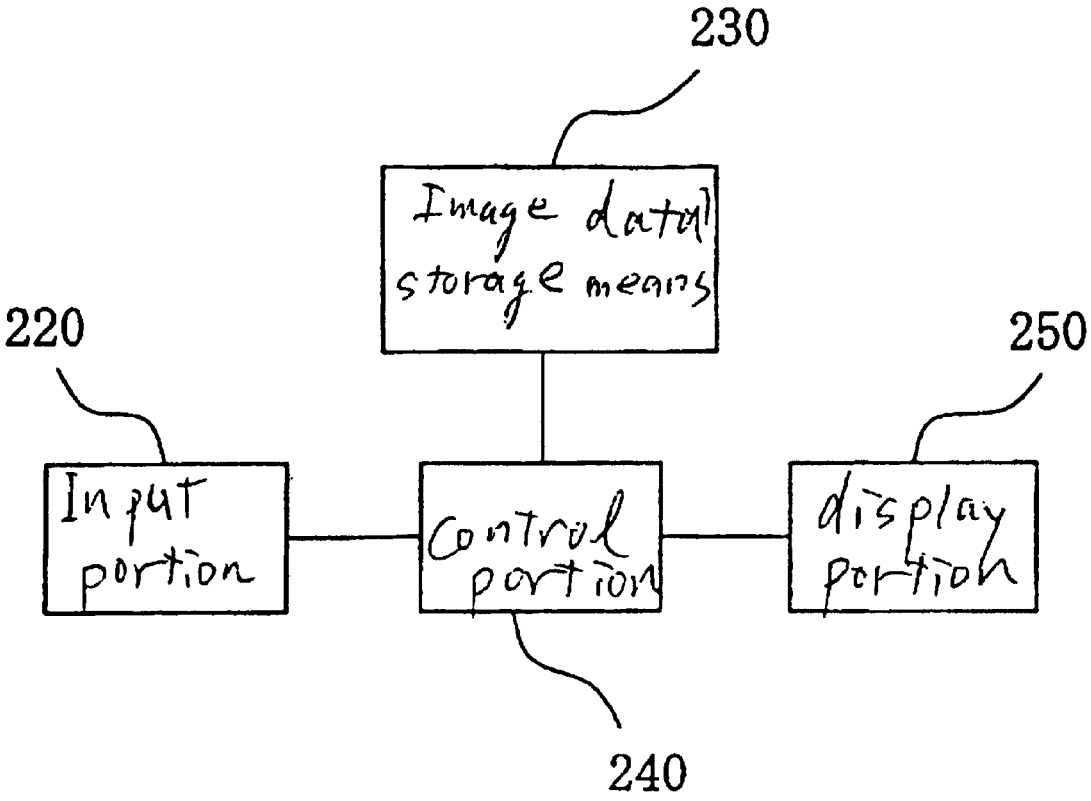
FIG. 27 is a view showing the circuit configuration used in the display unit 210.

Referring to FIG. 27, the displaying method in the display unit 210 will be described below. Image data given from an input portion 220 is temporarily stored in an image data storage means 230. A control portion 240 includes a pattern selection circuit, a luminance modulation circuit, and a blinking circuit which are not shown. The control portion 240 outputs a control signal to control the ON state of each LED unit 212 in accordance with the image data stored in the image data storage means 230. Each LED unit 212 is turned on with the luminance and color in accordance with the control signal. Accordingly, a specific shape or the like can be displayed with specific luminance and color on the display portion 250.

Although the above description has been made upon the case where each of the LED units in the display unit 210 is constituted by a combination of RGB LEDs and a W-LED, the present invention can be applied also to the case where each LED unit is constituted by W-LED(s) alone. In this case, a display unit in which an optional shape or the like can be displayed with white (when W-LED is turned on) or with black (when W-LED is turned off) can be obtained if the display portion 250 is formed from LED units disposed in the form of a matrix. Also in this case, the luminance of each LED unit can be tone-controlled, so that the display unit can be used as a monochrome LED display or the like.

(Embodiment 10)

Figure 28:
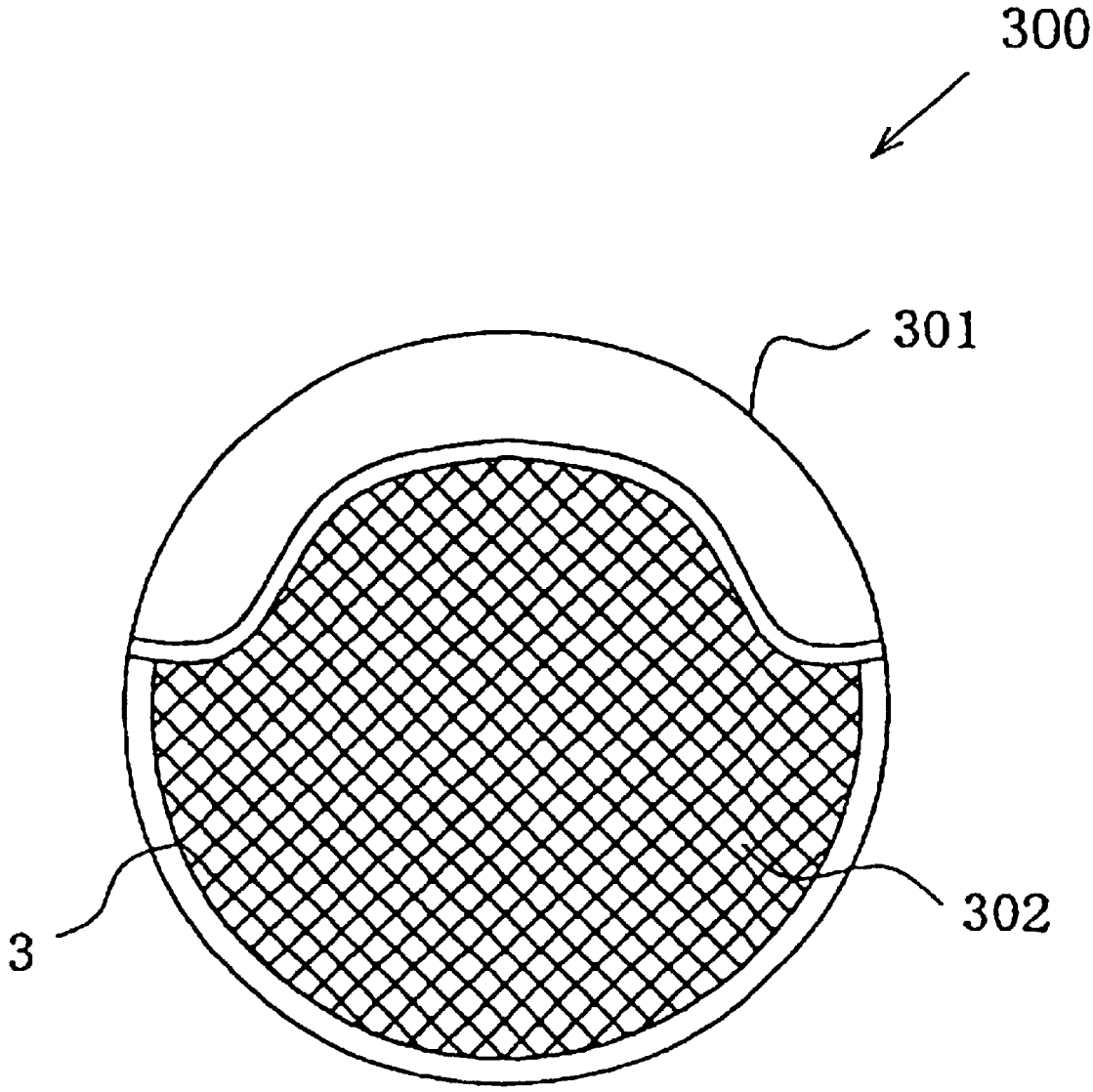
FIG. 28 is a view showing a vehicle signal unit 300 using LEDs 3 which is an embodiment of the present invention.

FIG. 28 is a view showing a vehicle signal unit 300 using chip type LEDs 3. The signal unit 300 has a display portion 302. Chip type LEDs 3 are disposed in the form of a matrix in the display portion 302. In FIG. 28, the reference numeral 301 designates a casing. The display portion 302 is covered with a colored transparent cover not shown. The ON state of each LED 3 is controlled by a control means. White light generated in the ON state of each LED 3 is colored when the light passes through the colored transparent cover. As a result, the colored light is viewed. Of course, a colorless transparent cover may be used so that a signal unit for displaying white color is provided. Supply of an electric source to the respective LEDs 3 is performed by parallel or series connection of the respective LEDs 3. When the LEDs are series-connected, the LEDs 3 may be classified into a plurality of groups so that an electric source can be supplied to each group. When, for example, LED groups are arranged in the display portion so that concentric circles are drawn, the display portion can be provided as a display portion 302 having LEDs arranged circularly as a whole. Incidentally, control of the ON state maybe performed by each LED group.

When chip type LEDs 3 are used in the form of a matrix to thereby form a light source, light can be emitted with uniform luminance on the whole display portion. Hence, unevenness of luminance which occurs when the background-art electric bulbs are used can be reduced. When control of the ON state is performed by each LED group as described above, display with partially different luminance can be made.

Incidentally, the method of arrangement of chip type LEDs 3 and the density of arrangement thereof can be selected at option in accordance with the purpose.

(Embodiment 11)

Specifications of respective layers in the light-emitting device 10 according to this embodiment are as follows. The fundamental structure is same as that of the embodiment 1 shown in FIG. 2 except that p-AlGaN is used for the p-type layer 15 in place of p-GaN.

| Layer: | Composition: | Dopant | (Thickness) |
|---|---|---|---|
| p-type layer 15: | p-AlGaN: | Mg | (0.3 μm) |
| Light-emitting layer 14: | Superlattice structure | | |
| Quantum well layer: | $In_{0.15}Ga_{0.85}N$ | | (3.5 nm) |
| Barrier layer: | GaN | | (3.5 nm) |
| The number of repeated quantum well and barrier layers: 1 to 10 | | | |
| n-type layer 13: | n-GaN: | Si | (4 μm) |
| Buffer layer 12: | AlN | | (10 nm) |
| Substrate 11: | Sapphire | | (300 μm) |

The present invention is not limited to the embodiments and the description thereof at all. Various modifications which can be easily conceived by those skilled in the art may be contained in the present invention without departing from the description of the scope of claim.

What is claimed is:

1. A light-emitting unit comprising:

a light-emitting device for emitting light with a wavelength range of from 360 nm to 550 nm; and a fluorescent material comprising Ca—Al—Si—O—N oxynitride activated with $Eu^{2+}$, wherein at least a part of said light emitted from said light-emitting device is subjected to wavelength conversion by said fluorescent material.

2. A light-emitting unit according to claim 1, wherein said light-emitting device emits light with a wavelength range of from 450 nm to 550 nm, and wherein said part of said light with the converted wavelength is mixed with the other part of said light emitted from said light-emitting device, so that white light is emitted.

3. A light-emitting unit according to claim 1, further comprising:

a light transmissible material, wherein said fluorescent material comprises one of a powdery material and a granular material and is formed in said light-transmissible material.

4. A light-emitting unit according to claim 1, wherein said fluorescent material comprises a glassy material.

5. A light-emitting unit according to claim 1, wherein said light-emitting device comprises a group III nitride compound semiconductor light-emitting device.

6. A light-emitting unit according to claim 3, wherein the light-emitting device is mounted in a cup portion provided in a lead frame, and the cup portion is filled with the light-transmissible material including the fluorescent material.

7. A light-emitting unit according to claim 3, wherein the light-emitting device is mounted in a cup portion provided in a lead frame, and a fluorescent layer made from the light-transmissible material including the fluorescent material is provided on a surface of the light-emitting device.

8. A light-emitting unit according to claim 3, wherein the light-emitting device is mounted in a cup portion provided in a lead frame, and the light-emitting device and a part of the lead frame are covered with the light-transmissible material including the fluorescent material.

9. A light-emitting unit according to claim 3, wherein the light-emitting device is mounted on a substrate, and a fluorescent layer comprising the light-transmissible material including the fluorescent material is provided on a surface of the light-emitting device.

10. A light-emitting unit according to claim 3, wherein the light-emitting device is mounted on a substrate, and the light-emitting device is sealed with the light-transmissible material including the fluorescent material.

11. A light-emitting unit according to claim 3, wherein the light-emitting device is mounted in a cup portion provided in a substrate, and the cup portion is filled with the light-transmissible material including the fluorescent material.

12. A light-emitting unit according to claim 3, wherein the light-emitting device is mounted in a cup portion provided in a substrate, and a fluorescent layer made from the light-transmissible material including the fluorescent material is provided on a surface of the light-emitting device.

13. A light-emitting unit according to claim 3, wherein a fluorescent layer made from the light-transmissible material including the fluorescent material is provided on a substrate surface of the light-emitting device.

14. A light-emitting unit according to claim 3, wherein a fluorescent layer made [form] *from* the light-transmissible material including the fluorescent material is also provided on a side surface of the light-emitting device.

15. A light-emitting unit according to claim 3, wherein a reflection plate is provided in a light-emitting direction of the light-emitting device.

16. A light-emitting unit according to claim 15, wherein a fluorescent layer made from the light-transmissible material including the fluorescent material is provided on a surface of the reflection plate opposite to the light-emitting device.

17. A light-emitting unit according to claim 3, wherein a fluorescent layer made from the light-transmissible material including the fluorescent material is provided in a light-emitting direction of the light-emitting device.

18. A light-emitting unit according to claim 17, further comprising:

a light guide having a light introduction surface and a light-emitting surface, wherein the light-emitting device is disposed so as to face the light introduction surface of the light guide, and the fluorescent layer is disposed between the light-emitting device and the light introduction surface of the light guide.

19. A light-emitting unit according to claim 17, further comprising:

a light guide having a light introduction surface and a light-emitting surface, wherein the light-emitting device is disposed so as to face the light introduction surface of the light guide, and the fluorescent layer is disposed on the light-emitting surface side of the light guide.

20. A light-emitting unit according to claim 19, further comprising:

a layer of a light-transmissible material disposed between the light guide and the fluorescent layer.

21. A light-emitting unit according to claim 4, wherein a fluorescent layer comprising the fluorescent material is provided on a substrate surface of the light-emitting device.

22. A light-emitting unit according to claim 21, wherein a fluorescent layer comprising the fluorescent material is also provided on a side surface of the light-emitting device.

23. A light-emitting unit according to claim 4, wherein a reflection plate is provided in a light-emitting direction of the light-emitting device.

24. A light-emitting unit according to claim 23, wherein the reflection plate comprises the fluorescent material, and a surface of the reflection plate opposite to a surface facing the light-emitting device is planished as a mirror surface.

25. A light-emitting unit according to claim 4, wherein a fluorescent layer comprising the fluorescent material is provided in a light-emitting direction of the light-emitting device.

26. A light-emitting unit according to claim 25, further comprising:

a light guide having a light introduction surface and a light-emitting surface, wherein the light-emitting device is disposed so as to face the light introduction surface of the light guide, and the fluorescent layer is disposed between the light-emitting device and the light introduction surface of the light guide.

27. A light-emitting unit according to claim 25, further comprising:

a light guide having a light introduction surface and a light-emitting surface, wherein the light-emitting device is disposed so as to face the light introduction surface of the light guide, and the fluorescent layer is disposed on the light-emitting surface side of the light guide.

28. A light-emitting unit according to claim 27, further comprising:

a layer of a light-transmissible material disposed between the light guide and the fluorescent layer.

29. A light-emitting method comprising:

irradiating a fluorescent material made of Ca—Al—Si—O—N oxynitride activated with $Eu^{2+}$ with light emitted from a light-emitting device with an emission wavelength range of from 360 nm to 550 nm to thereby convert the wavelength of a part of said light; and mixing said part of said light with the converted wavelength with the other part of said light emitted from said light-emitting device to thereby emit resultant light, wherein said light-emitting device is turned on intermittently.

30. A light-emitting method according to claim 29, wherein the time when said light-emitting device is turned on is adjusted to thereby adjust the color of light emitted from said light-emitting unit.

31. A light-emitting method according to claim 30, wherein said light-emitting device emits light with an emission wavelength range of from 480 nm to 550 nm, and wherein said color of said emitted light is white.

32. A light-emitting method according to claim 29, wherein said light-emitting device comprises a group III nitride compound semiconductor light-emitting device.

33. A light-emitting unit according to claim 1, wherein said fluorescent material has a mean grain size which is not greater than 20 μm.

34. A light-emitting unit according to claim 1, wherein said fluorescent material has a mean grain size which is not greater than 10 μm.

35. A light-emitting unit according to claim 1, wherein said fluorescent material has a mean grain size which is not greater than 5 μm.

36. A light-emitting unit according to claim 3, wherein said light transmissible material comprises one of epoxy resin, silicone resin, urea resin and glass.

37. A fluorescent material for a light-emitting unit, said material comprising Ca—Al—Si—O—N oxynitride activated with $Eu^{2+}$.

*38. A light-emitting unit comprising:*

*a light-emitting device for emitting light with a wavelength range of from 360 nm to 550 nm; and*

*a fluorescent material comprising an alkaline earth metal, Al, Si and N, and said fluorescent material being activated with a rare earth element,*

*wherein at least a part of said light emitted from said light-emitting device is subjected to wavelength conversion by said fluorescent material.*

*39. A light-emitting unit according to claim 38, wherein said rare-earth element comprises $Eu^{2+}$.*

*40. A light-emitting unit according to claim 38, wherein said fluorescent material further comprises oxygen.*

*41. A light-emitting unit according to claim 38, wherein said alkaline earth metal comprises calcium.*

*42. A light-emitting unit according to claim 38, further comprising:*

*a light-transmissible material,*

*wherein said fluorescent material comprises one of a powdery material and a granular material and is formed in said light-transmissible material.*

*43. A light-emitting unit according to claim 42, wherein said light-transmissible material is formed as a fluorescent layer which is formed in a light-emitting direction of the light-emitting device.*

*44. A light-emitting unit according to claim 38, wherein said light-emitting device emits light with a wavelength range of from 450 nm to 550 nm,*

*wherein at least a part of said light emitted from said light-emitting device is subjected to wavelength conversion by said fluorescent material, and*

*wherein said part of said light with the converted wavelength is mixed with the other part of said light emitted from said light-emitting device, such that white light is emitted.*

*45. A light-emitting unit according to claim 38, wherein said light-emitting device comprises a group III nitride compound semiconductor light-emitting device.*

*46. A light-emitting unit according to claim 38, wherein said fluorescent material comprises a mean grain size which is not greater than 20 μm.*

*47. A light-emitting unit according to claim 42, wherein said light-transmissible material comprises one of epoxy resin, silicone resin, urea resin and glass.*

*48. A method of preparing a fluorescent material for a light-emitting unit, said method comprising:*

*forming a mixture comprising an alkaline earth metal, Al, Si, N and a rare earth element, and*

*processing said mixture to obtain said fluorescent material,*

*wherein an amount of nitrogen in said fluorescent material is controlled to obtain a desired emission wavelength of said fluorescent material.*

* * * * *